US009502282B2

(12) United States Patent
Hagiwara et al.

(10) Patent No.: US 9,502,282 B2
(45) Date of Patent: Nov. 22, 2016

(54) METHOD OF SEMICONDUCTOR MANUFACTURE UTILIZING LAYER ARRANGEMENT TO IMPROVE AUTOFOCUS

(71) Applicant: Renesas Electronics Corporation, Kawasaki-shi, Kanagawa (JP)

(72) Inventors: Takuya Hagiwara, Kanagawa (JP); Tatsunori Murata, Kanagawa (JP); Masahiro Tadokoro, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 1 day.

(21) Appl. No.: 14/586,915

(22) Filed: Dec. 30, 2014

(65) Prior Publication Data

US 2015/0194340 A1 Jul. 9, 2015

(30) Foreign Application Priority Data

Jan. 7, 2014 (JP) ................................. 2014-000866

(51) Int. Cl.
| | |
|---|---|
| *H01L 21/768* | (2006.01) |
| *H01L 21/027* | (2006.01) |
| *H01L 21/268* | (2006.01) |
| *H01L 21/311* | (2006.01) |
| *G03F 9/00* | (2006.01) |

(52) U.S. Cl.
CPC ....... *H01L 21/76802* (2013.01); *G03F 9/7026* (2013.01); *H01L 21/0274* (2013.01); *H01L 21/0276* (2013.01); *H01L 21/268* (2013.01); *H01L 21/31116* (2013.01); *H01L 21/31138* (2013.01); *H01L 21/31144* (2013.01); *H01L 21/76805* (2013.01)

(58) Field of Classification Search
CPC .............. H01L 21/02118; H01L 21/76802; H01L 21/0274; H01L 21/0276; H01L 21/268
See application file for complete search history.

(56) References Cited

U.S. PATENT DOCUMENTS

| | | | | |
|---|---|---|---|---|
| 5,851,302 A | * | 12/1998 | Solis ......................... | G03F 7/36 134/1.2 |
| 6,309,801 B1 | * | 10/2001 | Meijer .............. | H01L 21/02118 257/E21.256 |
| 6,617,265 B2 | * | 9/2003 | Tanaka ...................... | G03F 1/56 257/E21.029 |
| 6,677,107 B1 | * | 1/2004 | Hasegawa ................. | G03F 1/14 430/311 |
| 2002/0001778 A1 | * | 1/2002 | Latchford ............... | G03F 7/091 430/313 |

FOREIGN PATENT DOCUMENTS

| | | |
|---|---|---|
| JP | 2005-166997 A | 6/2005 |
| JP | 2012-004170 A | 1/2012 |

OTHER PUBLICATIONS

Lange et. al, "Advantages of Broadband Illumination for Critical Defect Capture at the 65-nm Node and below" 2007, KLA-Tenor Corporation.*

* cited by examiner

*Primary Examiner* — Mohammad Islam
*Assistant Examiner* — Christina Sylvia
(74) *Attorney, Agent, or Firm* — Shapiro, Gabor and Rosenberger, PLLC

(57) ABSTRACT

In a method of manufacturing a semiconductor device using high-NA ArF liquid immersion exposure of a photoresist, a layer arrangement is provided capable of increasing reflection of a reference beam in an oblique incidence autofocus optical system, thereby enhancing autofocus and making it possible to reduce variation in the diameter of a contact hole.

15 Claims, 28 Drawing Sheets

FIG. 22

ONE EXAMPLE OF PRINCIPAL PARAMETERS OF EACH LAYER

| MATERIAL | FILM THICKNESS | EXPOSURE LIGHT OPTICAL CONSTANT @193nm | | REFERENCE LIGHT OPTICAL CONSTANT @680nm | |
|---|---|---|---|---|---|
| | | n VALUE | k VALUE | n VALUE | k VALUE |
| PHOTORESIST | 200nm | 1.7 | 0.036 | 1.54 | 0 |
| INTERMEDIATE LAYER | 80nm | 1.65 | 0.15 | 1.43 | 0 |
| LOWER LAYER | 200nm | 1.4 | 0.35 | 1.64 | 0 |
| REFERENCE LIGHT REFLECTION ACCELERATING FILM IN AUTOFOCUS OPTICAL SYSTEM | 25nm | 2.66 | 0.24 | 2.2 | 0 |
| INTERLAYER INSULATING FILM | 400nm | 1.563 | 0 | 1.45 | 0 |
| Si SUBSTRATE | — | 0.883 | 2.778 | 3.858 | 0.017 |

FIG. 23

RELATIONSHIP BETWEEN THICKNESS OF SILICON NITRIDE FILM AND EXPOSURE CHARACTERISTICS AND THE LIKE

| SiN n VALUE (680nm) | SiN FILM THICKNESS | PERCENTAGE OF LIGHT ENTERING INTERLAYER INSULATING FILM (%) | IN-WAFER-PLANE VARIATION IN PATTERN SIZE $3\sigma$ (nm) |
|---|---|---|---|
| WITHOUT SiN | | 41.15 | 13.2 |
| WITHOUT SiN | | 41.15 | 9.8 |
| WITHOUT SiN | | 41.15 | 11.3 |
| 1.79 | 25 | 39.14 | 10.2 |
| 1.93 | 20 | 39.01 | 8.3 |
| 1.93 | 25 | 38.66 | 3.6 |
| 2.2 | 20 | 38.52 | 4.3 |
| 2.2 | 25 | 38.31 | 3.5 |

FIG. 25

ONE EXAMPLE OF PRINCIPAL PARAMETERS
OF EACH LAYER IN MODIFICATION EXAMPLE

| MATERIAL | FILM THICKNESS | EXPOSURE LIGHT OPTICAL CONSTANT @193nm | | REFERENCE LIGHT OPTICAL CONSTANT @680nm | |
|---|---|---|---|---|---|
| | | n VALUE | k VALUE | n VALUE | k VALUE |
| PHOTORESIST | 200nm | 1.7 | 0.036 | 1.54 | 0 |
| INTERMEDIATE LAYER | 80nm | 1.65 | 0.15 | 1.43 | 0 |
| LOWER LAYER | 200nm | 1.4 | 0.35 | n2 | 0 |
| INTERLAYER INSULATING FILM | 400nm | 1.563 | 0 | 1.45 | 0 |
| Si SUBSTRATE | — | 0.883 | 2.778 | 3.858 | 0.017 |

METHOD OF SEMICONDUCTOR MANUFACTURE UTILIZING LAYER ARRANGEMENT TO IMPROVE AUTOFOCUS

CROSS-REFERENCE TO RELATED APPLICATIONS

The disclosure of Japanese Patent Application No. 2014-000866 filed on Jan. 7, 2014 including the specification, drawings, and abstract is incorporated herein by reference in its entirety.

BACKGROUND

The present application relates to a method of manufacturing a semiconductor integrated circuit device (or a semiconductor device), for example, a method that can be applied to an exposure technology.

Japanese Unexamined Patent Application Publication No. 2012-4170 (Patent Document 1) relates to an exposure technology of a multilayer resist having, for example, a carbon-rich film as a lower layer, a silicon-rich film as an intermediate layer, and a photosensitive resist film as an upper layer. Disclosed therein is a technology of treating the multilayer resist with ozone prior to removal of the silicon-rich film serving an intermediate layer upon a rework process and then carrying out wet treatment with a chemical liquid.

Japanese Unexamined Patent Application Publication No. 2005-166997 (Patent Document 2) relates to a liquid immersion exposure apparatus using an oblique incidence type focus detection system. Disclosed therein is a technology of increasing an incidence angle to more than 84 degrees so as to achieve adequate reflection of an obliquely incident detection light at a resist surface.

[Patent Document 1] Japanese Unexamined Patent Application Publication No. 2012-4170

[Patent Document 2] Japanese Unexamined Patent Application Publication No. 2005-166997

SUMMARY

For example, in high-NA ArF immersion exposure after the 45 nm technology node, particularly, in microfabrication steps such as contact step, variation in the diameter of a contact hole or the like has occurred frequently.

A means for overcoming such a problem will hereinafter be described. Another problem and a novel feature will be apparent from the description herein and accompanying drawings.

A typical embodiment, among those disclosed herein, will hereinafter be outlined briefly.

In the outline of one embodiment described herein, a silicon nitride-based insulating film is inserted between a multilayer resist and an insulating film to be processed in a contact step or the like.

An advantage available by the typical embodiment disclosed herein will next be described briefly.

According to the one embodiment described herein, variation in the diameter of a contact hole or the like in a contact step or the like step can be reduced.

BRIEF DESCRIPTION OF THE DRAWINGS

FIG. 22 shows an example of principal parameters of each layer for complementarily describing the main-part process of the method of manufacturing a semiconductor integrated circuit device according to First Embodiment of the present application;

FIG. 23 shows numerical data of various test results for complementarily describing the main-part process of the method of manufacturing a semiconductor integrated circuit device according to First Embodiment of the present application;

FIG. 25 shows one example of principal parameters of each layer for complementarily describing the main-part process of a modification example of the method of manufacturing a semiconductor integrated circuit device according to First Embodiment of the present application;

DETAILED DESCRIPTION

[Outline of Embodiment]

Figure 1:
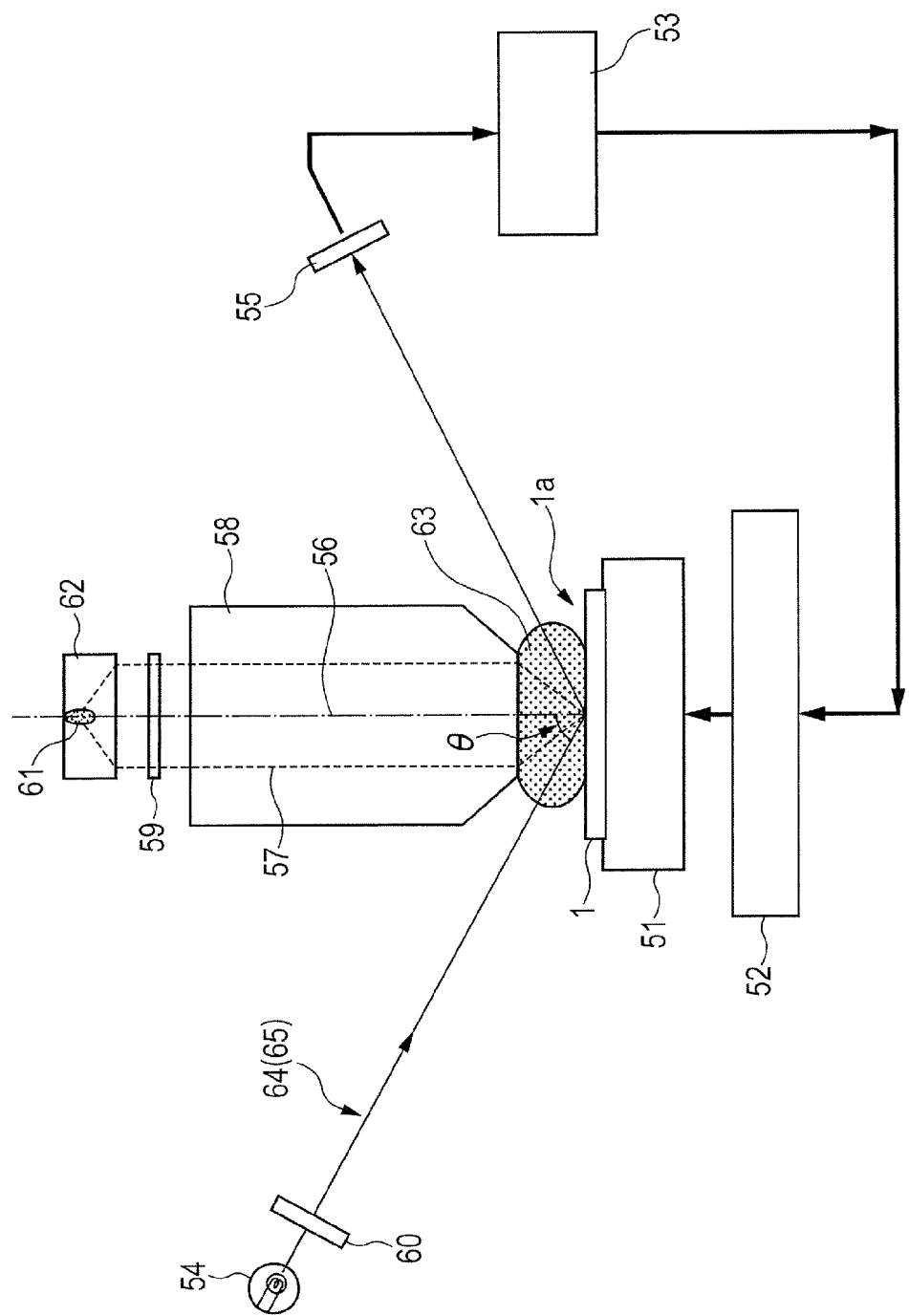
FIG. 1 is a schematic cross-sectional view showing the main part of one example of an exposure apparatus to be used in the method of manufacturing a semiconductor integrated circuit device according to First Embodiment of the present application.

First, the outline of a typical embodiment disclosed herein will be described.

1. A method of manufacturing a semiconductor integrated circuit device including the steps of: (a) forming a first silicon nitride-based insulating film over a first main surface of a semiconductor wafer; (b) forming a first silicon oxide-based insulating film over the first silicon nitride-based insulating film; (c) forming a second silicon nitride-based insulating film over the first silicon oxide-based insulating film; (d) applying a carbon-rich film onto the second silicon nitride-based insulating film; (e) applying a silicon-containing film containing carbon and silicon as main components thereof onto the carbon-rich film; (f) applying a photoresist film onto the silicon-containing film; (g) exposing the photoresist film by reduction projection exposure using an ultraviolet exposure light; (h) after the step (g), developing and thereby patterning the photoresist film and transferring the resulting pattern to the silicon-containing film and the carbon-rich film successively; (i) forming a through-hole in the second silicon nitride-based insulating film by first dry etching with the resulting carbon-rich film as a mask; (j) after the step (i), extending the through-hole to the bottom surface of the first silicon oxide-based insulating film by second dry etching with the carbon-rich film as a mask; (k) after the step (j), removing the carbon-rich film; and (l) after the step (k), removing the second silicon nitride-based insulating film outside the through-hole and the first silicon nitride-based insulating film inside the through-hole. In the step (g), by an off-axis type oblique incidence autofocus optical system using a reference beam having a wavelength longer than that of the ultraviolet exposure light, the reference beam is made incident obliquely to the first main surface of the semiconductor wafer and based on the reflected light, autofocusing is performed.

2. In the method of manufacturing a semiconductor integrated circuit device as described above in 1, the second silicon nitride-based insulating film is a silicon nitride film.

3. In the method of manufacturing a semiconductor integrated circuit device as described above in 1 or 2, the ultraviolet exposure light is an exposure light having a wavelength of 193 nm from an ArF excimer laser.

4. In the method of manufacturing a semiconductor integrated circuit device as described above in any of 1 to 3, the reference beam is a visible light.

5. In the method of manufacturing a semiconductor integrated circuit device as described above in any of 1 to 3, the reference beam is a broadband light in the visible region.

6. In the method of manufacturing a semiconductor integrated circuit device as described above in any of 1 to 5, the reduction projection exposure is liquid immersion exposure.

7. In the method of manufacturing a semiconductor integrated circuit device as described above in 6, a liquid used in the liquid immersion exposure contains water as a main component thereof.

8. In the method of manufacturing a semiconductor integrated circuit device as described above in any of 1 to 7, the reduction projection exposure is performed using a halftone mask.

9. In the method of manufacturing a semiconductor integrated circuit device as described above in 5 or 8, a percentage of the reference beam entering the first silicon oxide-based insulating film in the step (g) is 38.7% or less in terms of an entering percentage of a center-wavelength reference beam.

10. A method of manufacturing a semiconductor integrated circuit device including the steps of: (a) forming a first silicon nitride-based insulating film over a first main surface of a semiconductor wafer; (b) forming a first silicon oxide-based insulating film over the first silicon nitride-based insulating film; (c) applying a carbon-rich film onto the first silicon oxide-based insulating film; (d) applying a silicon-containing film containing carbon and silicon as main components thereof onto the carbon-rich film; (e) applying a photoresist film onto the silicon-containing film; (f) exposing the photoresist film by reduction projection exposure using an ultraviolet exposure light; (g) after the step (f), developing and thereby patterning the photoresist film and transferring the resulting pattern to the silicon-containing film and the carbon-rich film successively; (h) forming a through-hole in the first silicon oxide-based insulating by first dry etching with the resulting carbon-rich film as a mask; (i) after the step (h), removing the carbon-rich film; and (j) after the step (i), removing the first silicon nitride-based insulating film inside the through-hole. In the above-mentioned method, (1) in the step (f), by an off-axis type oblique incidence autofocus optical system using a reference beam which is a broadband light in the visible region, the reference beam is made incident obliquely to the first main surface of the semiconductor wafer and based on the reflected light, autofocusing is performed; and (2) at this time, a percentage of the reference beam entering the first silicon oxide-based insulating film is 38.7% or less in terms of an entering percentage of a center-wavelength reference beam.

11. In the method of manufacturing a semiconductor integrated circuit device as described above in 10, the ultraviolet exposure light is an exposure light having a wavelength of 193 nm from an ArF excimer laser.

12. In the method of manufacturing a semiconductor integrated circuit device as described above in 10 or 11, the reduction projection exposure is liquid immersion exposure.

13. In the method of manufacturing a semiconductor integrated circuit device as described above in 12, the reduction projection exposure is performed using a halftone mask.

14. In the method of manufacturing a semiconductor integrated circuit device as described above in any of 10 to 13, a percentage of the reference beam entering the first silicon oxide-based insulating film in the step (g) is 38.7% or less in terms of an entering percentage of a center-wavelength reference beam.

15. In the method of manufacturing a semiconductor integrated circuit device as described above in any of 10 to 14, no silicon nitride-based insulating film is provided between the first silicon nitride-based insulating film and the carbon-rich film in at least the step (f).

[Explanation of Description Manner, Basic Terms, and Usage in the Present Application]

1. In the present application, a description of an embodiment may be made after divided in a plurality of sections if necessary for the sake of convenience. These sections are not independent from each other unless otherwise particularly specified, but they may each be a part of a single example or one of them may be a partial detail of the other or a modification example of a part or whole of the other one. In principle, a description of a portion similar to that described before is omitted. Moreover, constituent components in each mode are not essential unless otherwise particularly specified, limited to the number theoretically, or apparent from the context.

The term "semiconductor device" or "semiconductor integrated circuit device" as used herein refers mainly to various transistors (active elements) alone, devices obtained by integrating such a transistor as a main component, a resistor, a capacitor, and other components on a semiconductor chip (for example, a single crystal silicon substrate), and devices obtained by packaging a semiconductor chip or the like. Representative examples of the various transistors include MISFETs (metal insulator semiconductor field effect transistors) typified by MOSFETs (metal oxide semiconductor field effect transistors). Representative examples of the integrated circuit in this case include CMIS (complementary metal insulator semiconductor) integrated circuits typified by CMOS (complementary metal oxide semiconductor) integrated circuits having an N channel type MISFET and a P channel type MISFET in combination.

A wafer process of today's semiconductor integrated circuit devices, that is, LSI (large scale integration) is usually classified into two parts: an FEOL (front end of line) process and a BEOL (back end of line) process. The FEOL process roughly ranges from a step of carrying in a silicon wafer as a raw material to a premetal step (a step including formation of an interlayer insulating film and the like between the lower end of an M1 wiring layer and a gate electrode structure, formation of a contact hole, embedding of a tungsten plug, and the like). The BEOL process roughly ranges from formation of the M1 wiring layer to formation of a pad opening in a final passivation film on an aluminum-based pad electrode (in a wafer level package process, this process is also included).

In the present application, when a wiring and a via belonging to the same interlayer insulating film will be referred to, attention is paid to the layer of the interlayer insulating film and they are called by the name of the same layer. This means that a via between a first-layer buried wiring and a second-layer buried wiring is referred to as "second-layer via".

2. Similarly, even when such a term "X comprised of A" or the like is used in association with a material, a composition, or the like in the description of the embodiment or the like, it does not exclude a material, composition, or the like containing a component other than A as one of the main constituent components thereof unless otherwise particularly specified or apparent from the context that it excludes such a material, composition, or the like. For example, with regard to a component, the term means "X containing A as a main component" or the like. It is needless to say that even the term "silicon member" is not limited to pure silicon but embraces a multi-element alloy such as SiGe alloy or another one containing silicon as a main component and a member containing, in addition, an additive and the like.

Similarly, it is needless to say that the term "silicon oxide film", "silicon oxide-based insulating film", or the like means not only a relatively pure undoped silicon oxide (undoped silicon dioxide) film but also an insulating film having another silicon oxide as a main component thereof. For example, a silicon oxide-based insulating film doped with an impurity such as TEOS-based silicon oxide, PSG (phosphorus silicate glass), or BPSG (borophosphosilicate glass) is also a silicon oxide film. Additional examples of the silicon oxide film or silicon oxide-based insulating film include a thermal oxide film, a CVD oxide film, and a film obtained by the method of application such as SOG (spin on glass) and nano-clustering silica (NSC). Further, low-k insulating films such as FSG (fluorosilicate glass), SiOC (silicon oxycarbide), carbon-doped silicon oxide, and OSG (organosilicate glass) are also silicon oxide films or silicon oxide-based insulating films. Still further, silica-based Low-k insulating films (porous insulating films, in which the term "porous" embraces molecularly porous) obtained by introducing voids into a member similar to those mentioned above are silicon oxide films or silicon oxide-based insulating films.

Not only the silicon oxide-based insulating films but also silicon nitride-based insulating films are silicon-based insulating films ordinarily used in semiconductor fields. Examples of materials belonging to such films include SiN, SiCN, SiNH, and SiCNH. The term "silicon nitride" as used herein means both SiN and SiNH unless otherwise specifically indicated that it is not. Similarly, the term "SiCN" means both SiCN and SiCNH unless otherwise specifically indicated that it does not.

It is to be noted that although SiC has a property similar to that of SiN, however SiON (SiOC, SiOCN) should be classified as a silicon oxide-based insulating film in many cases. When SiON is used as an etch stop film or a reference beam reflection accelerating film, it has a property similar to SiC, SiN, or the like. These oxides and nitrides (carbides, carbonitrides) are therefore classified, depending on which is the main component of them.

Silicon nitride-based insulating films such as silicon nitride films are frequently used as an etch stop film in SAC (self-aligned contact) technology, that is, a CESL (contact etch-stop layer). They are also used as a stress imparting film in SMT (stress memorization technique).

3. The term "wafer" typically means a single-crystal silicon wafer on which a semiconductor integrated circuit device (which will equally apply to a semiconductor device or an electronic device) is formed. It is needless to say that it also embraces a composite wafer of an insulating substrate and a semiconductor layer or the like, such as an epitaxial wafer, an SOI substrate, or an LCD glass substrate.

4. Preferred examples of the shape, position, attribute, and the like will be shown below, however, it is needless to say that the shape, position, attribute, and the like are not strictly limited to these preferred examples unless otherwise specifically indicated or apparent from the context that they are strictly limited to these preferred examples. Therefore, for example, the term "square" embraces "substantially square"; the term "orthogonal" embraces "substantially orthogonal", and the term "coincide with" embraces "substantially coincide with". This also applies to the terms "parallel" and "right angle". For example, a position away by 10 degrees from a complete parallel position belongs to the term "parallel". This does not apply to an incidence angle of an oblique incidence autofocus system which will be described later (because this system mainly treats a region from a right angle to about 10 degrees therefrom).

The term "whole region", "overall region", "entire region", or the like embraces "substantially whole region", "substantially overall region", "substantially entire region" or the like. For example, the term "whole region", "overall region", or "entire region" embraces a portion of the region accounting for 80% or more of the area thereof. This also applies to "whole circumference", "whole length", or the like.

Further, with regard to the shape of a member or the like, the term "rectangular" embraces "substantially rectangular". For example, when a member has a rectangular portion and an unrectangular portion and an area of the latter portion is less than about 20% of the whole area, this member is regarded rectangular. This also applies to the term "circular" or the like. In this case, when a circular body is divided, a portion having this divided element portion inserted therein or exserted therefrom is a part of the circular body.

With regard to the term "periodic", the term "periodic" embraces "substantially periodic". When a difference in periodicity among components is less than about 20%, these components are regarded "periodic". Further, when less than about 20% of the components to be analyzed are outside the above range, these components are regarded "periodic" as a whole.

The definition in this section is a general one. When a different definition is applied to the following individual descriptions, priority is given to the definition used in the individual description. With regard to a portion not specified in the individual description, the definition or specification in this section is effective unless otherwise definitely denied.

5. When reference is made to any specific numeric value or amount, the specific numeric value or amount may be exceeded or may be underrun unless otherwise particularly specified, limited to the number theoretically, or apparent from the context that it is not exceeded or underrun.

6. The term "multilayer resist film" as used herein mainly means an integrated film obtained by stacking a plurality of films and serving, as a single film, as a photoresist film. Each layer is formed mainly by application. The term "application" is not limited to "spin coating". In the following example, the multilayer resist film is mainly composed of at least three films, that is, a silicon-containing film (film containing at least carbon and silicon as main components) configuring an intermediate layer, a carbon-rich film (film containing carbon as a main component and not containing silicon as a main component) lying under the silicon-containing film, and a photosensitive photoresist film lying on the carbon-containing film. The multilayer resist film does not exclude the presence of another film as an intermediate, lower, or upper layer. For example, it may have, as an uppermost layer, a top coat film for liquid immersion exposure.

The term "underlying film" in the "underlying silicon nitride-based insulating film of multilayer resist film" or "underlying film of multilayer resist film" means an optical characteristic controlling film inserted between the multilayer resist film and a film to be processed. It is removed immediately after removal of the multilayer resist film.

The term "broadband light" as used herein means a light having a total bandwidth of 100 nm or more.

[Details of Embodiment] Embodiment will next be described more specifically. In all the drawings in the embodiment, the same or like members will be identified by the same or like symbols or reference numerals and overlapping descriptions will be omitted in principle.

In the accompanying drawings, hatching or the like is sometimes omitted even from the cross-section when it makes the drawing complicated or when a member can be distinguished clearly from a vacant space. In relation thereto, even a planarly closed hole may be shown without a background contour thereof when it is obvious from the description or the like that the hole is planarly closed. On the other hand, hatching may be added even to a drawing which is not a cross section, in order to clearly show that it is not a vacant space.

With regard to alternative naming, when one of two members or the like is called "first" and the other is called "second", they are sometimes named according to the typical embodiment, but needless to say, their naming is not limited to this choice.

1. Description on the Main Part of One Example of an Exposure Apparatus to be Used in the Method of Manufacturing a Semiconductor Integrated Circuit Device According to First Embodiment of the Present Application (Mainly, FIG. 1)

FIG. 1 is a schematic cross-sectional view showing the main part of one example of an exposure apparatus to be used in the method of manufacturing a semiconductor integrated circuit device according to First Embodiment of the present application. Referring to it, the main part and the like of one example of an exposure apparatus to be used in the method of manufacturing a semiconductor integrated circuit device according to First Embodiment of the present application will be described.

First, referring to FIG. 1, the outline of an off-axis type oblique incidence autofocus optical system 65 will be described with a step-and-scan liquid immersion reduction projection exposure apparatus (for example, a reduction ratio: 4:1) as one example of a liquid immersion reduction projection exposure apparatus. A specific description will be made while using, as a reference beam 64, a broadband light (using, for example, a halogen lamp as a light source 54) of the visible region containing a light having a wavelength of 680 nm. It may be a broadband light not containing a light having a wavelength of 680 nm or it may not be a broadband light (meaning a monochromatic light or a narrowband light) irrespective of whether it contains a light having a wavelength of 680 nm or not. The reference beam may be a light of the ultraviolet region (broadband light, monochromatic light, or narrowband light) or may be a broadband light containing both a light of the visible region and a light of the ultraviolet region. Using a broadband light is advantageous because it can exclude interference. A specific description will hereinafter be made with a halogen lamp as an example of the light source 54 of a broadband reference beam. It is needless to say that a continuous spectrum light source other than halogen lamp may be usable. Using a light of the visible region is advantageous because it facilitates configuration of an optical system (also reduces the unit price of the optical system) and expands the range of choices.

As shown in FIG. 1, a semiconductor wafer 1 is placed, for example, on a wafer stage 51 with a surface 1a (first main surface) up. An autofocus optical system 65 uses, for example, a halogen lamp as a light source 54 and uses, for example, a broadband light of the visible region containing a light having a wavelength of 680 nm as a reference beam 64 via an optical filter 60 (band-pass filter). The wavelength region of the reference beam 64 is preferably, for example, from about 560 nm to 800 nm. An incidence angle θ of the reference beam 64 in an oblique incidence system is, for example, 85 degrees (preferably ranging, for example, from 80 degrees to 89 degrees). The reference beam 64 reflected at the surface 1a (to be exact, mainly a multilayer film boundary on the surface) of the semiconductor wafer 1 is incident on a position detecting photoelectric conversion element 55, is converted to an electronic signal distribution, and is subjected to data processing by a focus controller 53. Based on the data processing results, the focus controller 53 controls a stage controller 52 to control the perpendicular position and inclination of the wafer stage 51 to achieve autofocusing. This autofocusing is performed prior to exposure of a single wafer 1 or during exposure (at proper timing during step-and-scan). In this case, observation points on the wafer are made of a large number of (for example, several tens of) observation points distributed throughout the wafer surface.

Next, a description will be made simply on exposure. As shown in FIG. 1, an exposure optical system 58 is provided along an optical axis 56 (usually, it is not necessarily a straight line) of an optical system. For example, an exposure light 57 (for example, a monochromatic light having a wavelength of 193 nm) emitted from an exposure light source 61 such as ArF excimer laser is provided as a luminous flux equipped with predetermined characteristics (for example, circular illumination with σ: 0.7) by an exposure lighting system 62. This luminous flux (exposure light 57) penetrates through an optical mask 59 having a circuit pattern to be transferred (or is reflected when the mask is a reflective mask) and is collected on the semiconductor wafer 1 via a liquid 63 (for example, pure water) for liquid immersion by the exposure optical system 58 (for example, NA: 1.3). This means that basically, a real image of the circuit pattern on the optical mask 59 is projected so as to form an image on the photoresist film on the semiconductor wafer 1. The optical mask 59 preferably used here is, for example, a halftone mask having a transmission of about 6%. Exposure is carried out, for example, by a step-and-scan system (of course, another system such as stepping system may be employed) while performing the above-mentioned autofocusing. It is needless to say that as the exposure light, a light from various light sources (KrF, $F_2$) or a light having various wavelengths as well as a light having a wavelength of 193 nm can be used. An exposure light having a wavelength of 193 nm from an ArF excimer laser is however most preferred from the standpoints of a short wavelength (compared with that from a KrF excimer laser), price of a light source, availability of a pellicle, and the like.

It is needless to say that as the liquid 63 for liquid immersion, not only pure water (or liquids having water as a main component thereof) but also liquids having a dielectric constant equal to or greater than that of pure water can be used. Pure water and the like (that is, pure water and liquids having water as a main component thereof) are however advantageous because of handling ease in the process and also a low unit price.

As an exposure means, non-liquid immersion exposure as well as liquid immersion exposure can be used. Liquid immersion exposure however has the merit of providing higher resolution.

As the optical mask, as well as the halftone mask, a binary mask or another phase shift mask such as Levenson phase shift mask can be used. The halftone mask is however advantageous because it can be formed using a step almost similar to that of a binary mask, can be provided at a relatively low unit price (compared with a phase shift mask other than a halftone mask), and can bring a phase shift effect (resolution improving effect) of a certain level.

2. Description on the Main-Part Process of the Method of Manufacturing a Semiconductor Integrated Circuit Device According to First Embodiment of the Present Application (Mainly from FIGS. 2 to 14)

A specific description will next be made with a top coat less three-layer process as an example of a multilayer resist process. It is needless to say that the multilayer resist process is not limited to a three layer resist process but may be a two layer or four or more layer process. Alternatively, top coat may be used. The top coat less process is advantageous because it has a simple process configuration. The three layer process provides excellent cost performance as a multilayer resist process. As will be described later, the intermediate layer film and the lower layer film in the three layer process or the lower layer film in the two layer process can also be regarded functionally as an antireflective film.

In this section, a specific description will be made with a silicon nitride-based insulating film such as silicon nitride film as a reference beam reflection accelerating film (the silicon nitride-based insulating film 12 in FIG. 4), because the silicon nitride-based insulating film can be formed or removed easily and has good optical characteristics. It is however needless to say that, as well as the silicon nitride-based insulating film, another film containing nitrogen or carbon as one of the main components thereof and at the same time, containing silicon as another main component thereof can be used insofar as it lies between a multilayer resist and an underlying film to be processed, is capable of improving the reflectance thereat, and can be formed or removed relatively easily. It is needless to say that the reference beam reflection accelerating film containing oxygen shall not be excluded. The reference beam reflection accelerating film may be either an inorganic film or an organic film other than the silicon nitride-based insulating film and having a refractive index comparable to that of the silicon nitride-based insulating film.

Figure 2:
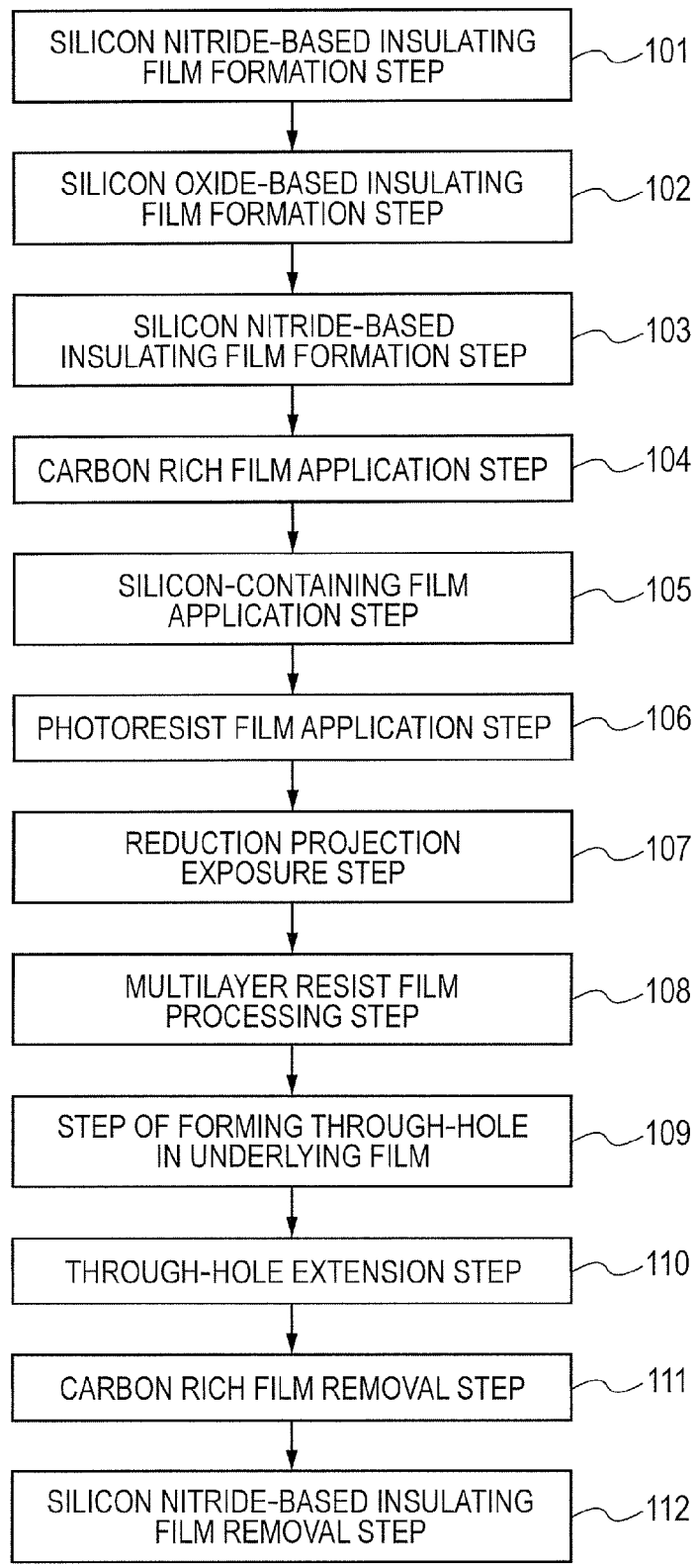
FIG. 2 is a block flow chart of a main part wafer process for describing a main-part process in the method of manufacturing a semiconductor integrated circuit device according to First Embodiment of the present application.
Figure 3:
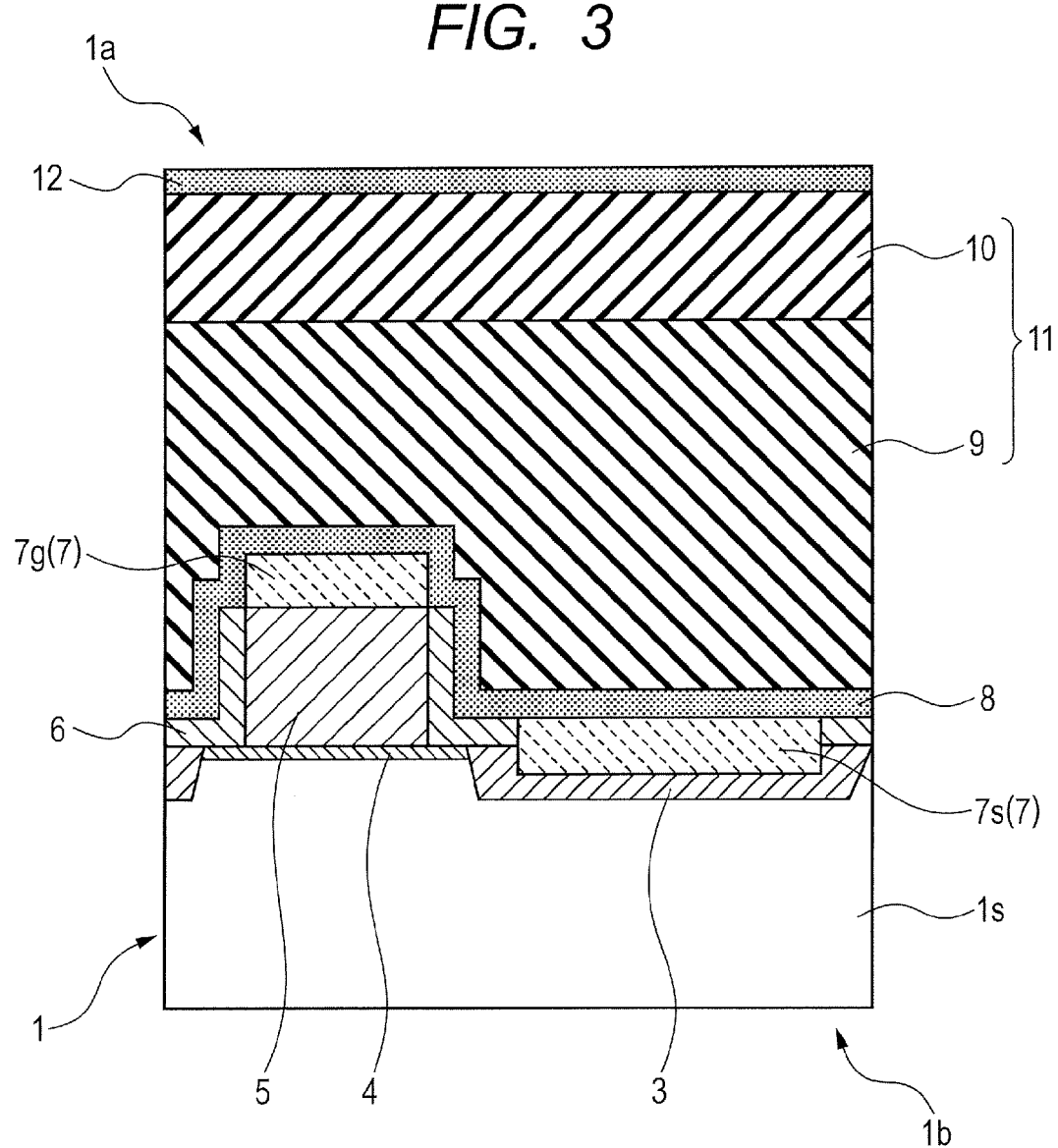
FIG. 3 is a wafer fragmentary cross-sectional view during a wafer process (a step of forming an underlying silicon nitride film of multilayer resist film) for describing the main-part process in the method of manufacturing a semiconductor integrated circuit device according to First Embodiment of the present application.
Figure 4:
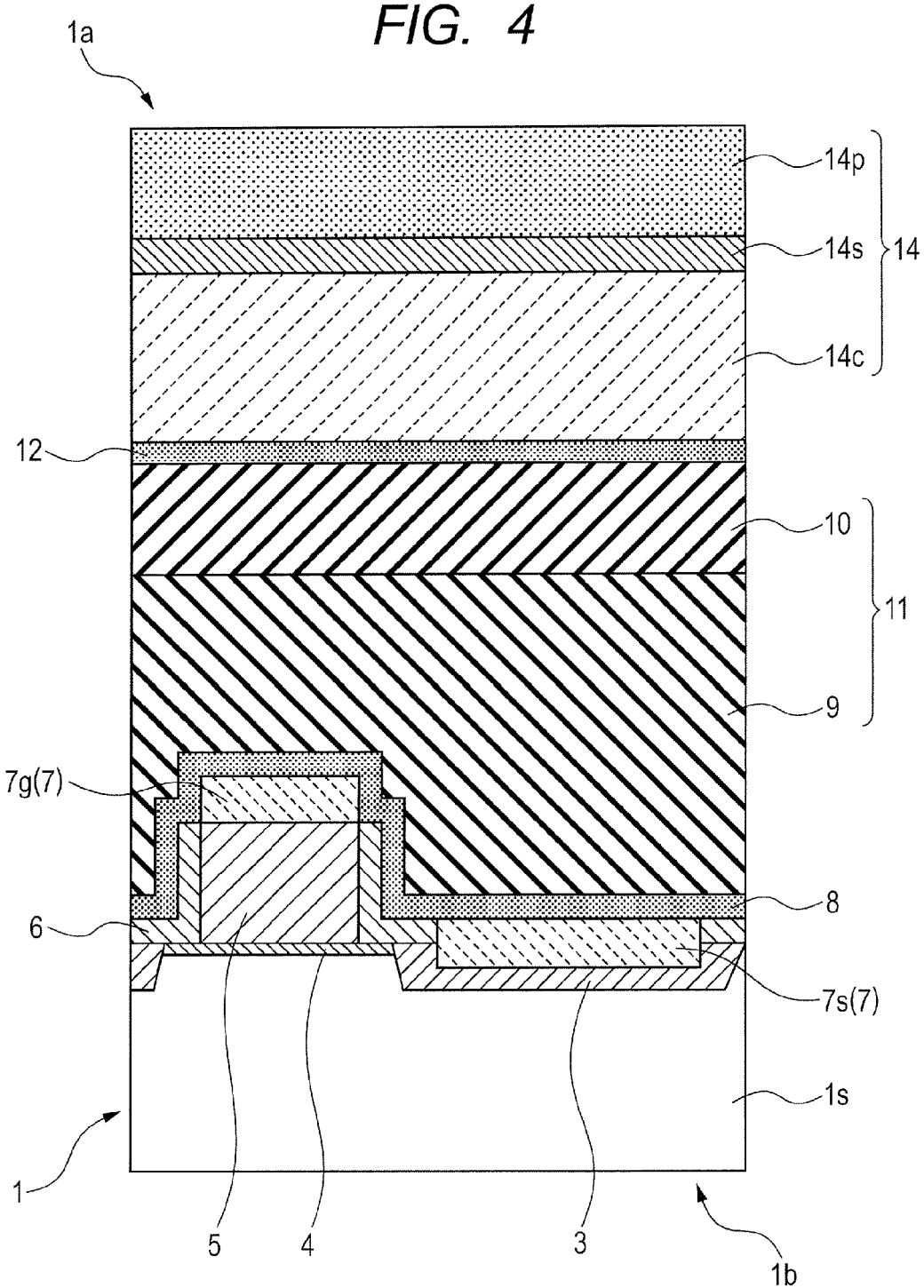
FIG. 4 is a wafer fragmentary cross-sectional view during a wafer process (a multilayer resist present application step) for describing the main-part process in the method of manufacturing a semiconductor integrated circuit device according to First Embodiment of the present application.
Figure 5:
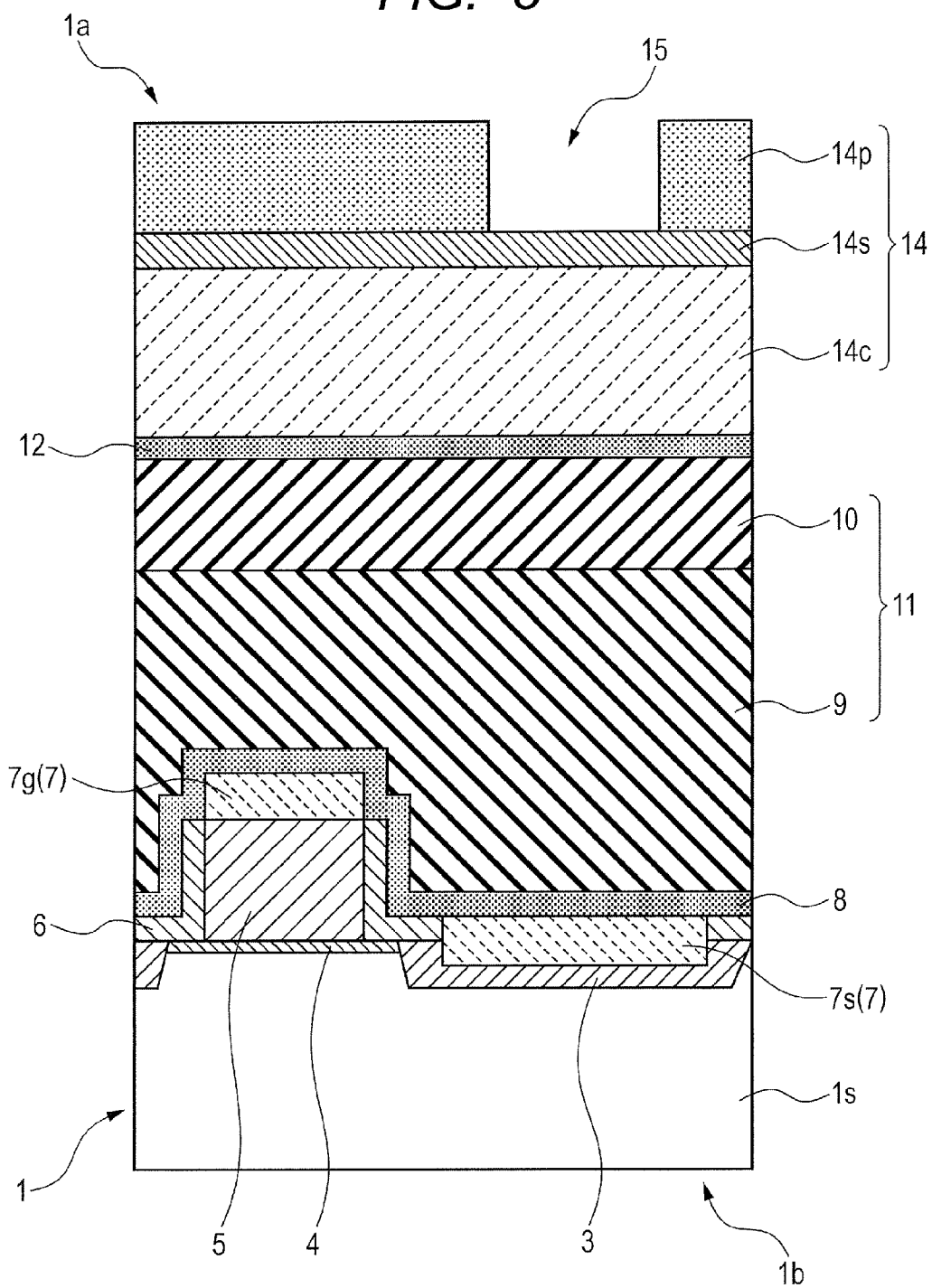
FIG. 5 is a wafer fragmentary cross-sectional view during a wafer process (a photosensitive resist film processing step) for describing the main-part process in the method of manufacturing a semiconductor integrated circuit device according to First Embodiment of the present application.
Figure 6:
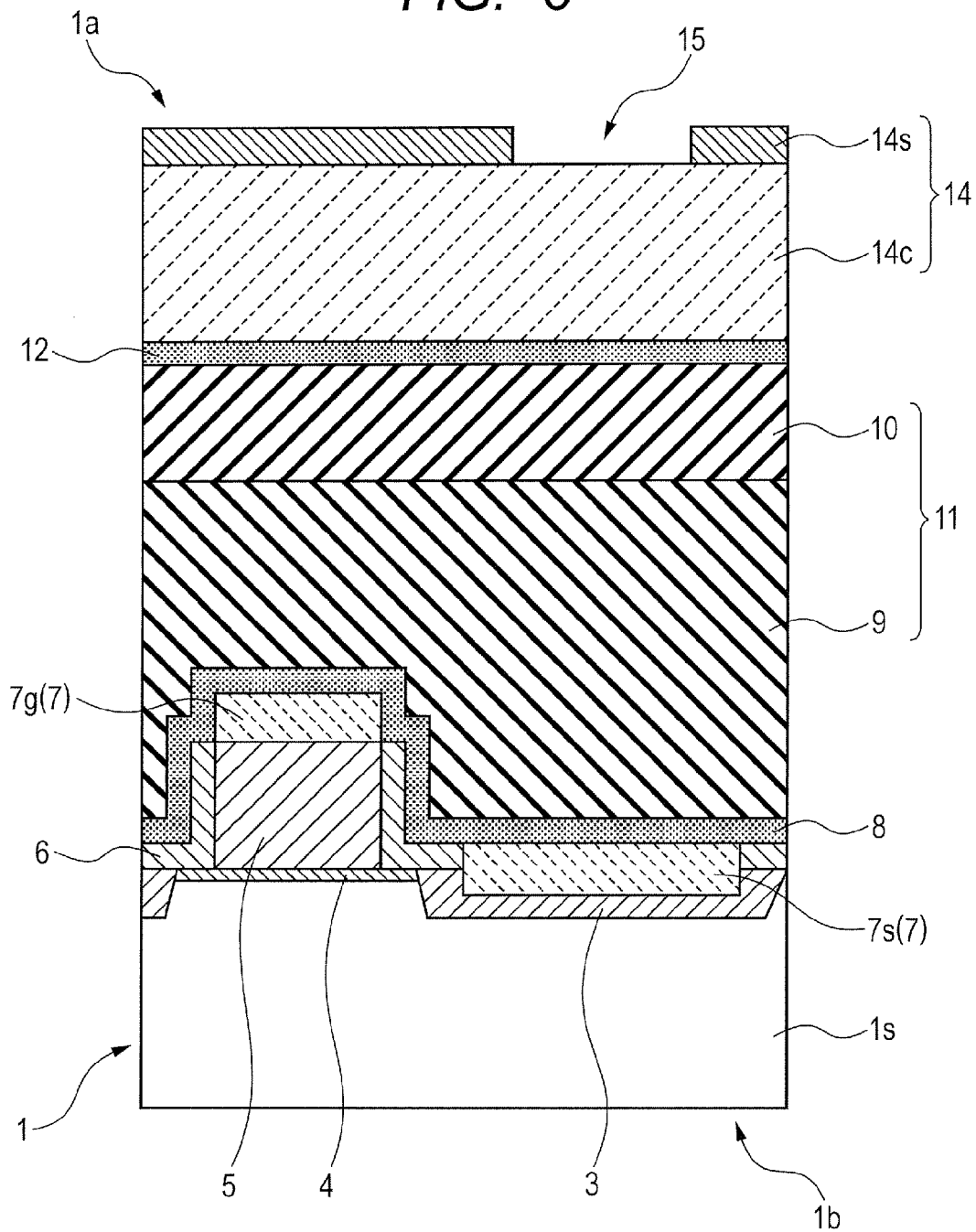
FIG. 6 is a wafer fragmentary cross-sectional view during a wafer process (an intermediate silicon-containing film processing step) for describing the main-part process in the method of manufacturing a semiconductor integrated circuit device according to First Embodiment of the present application.
Figure 7:
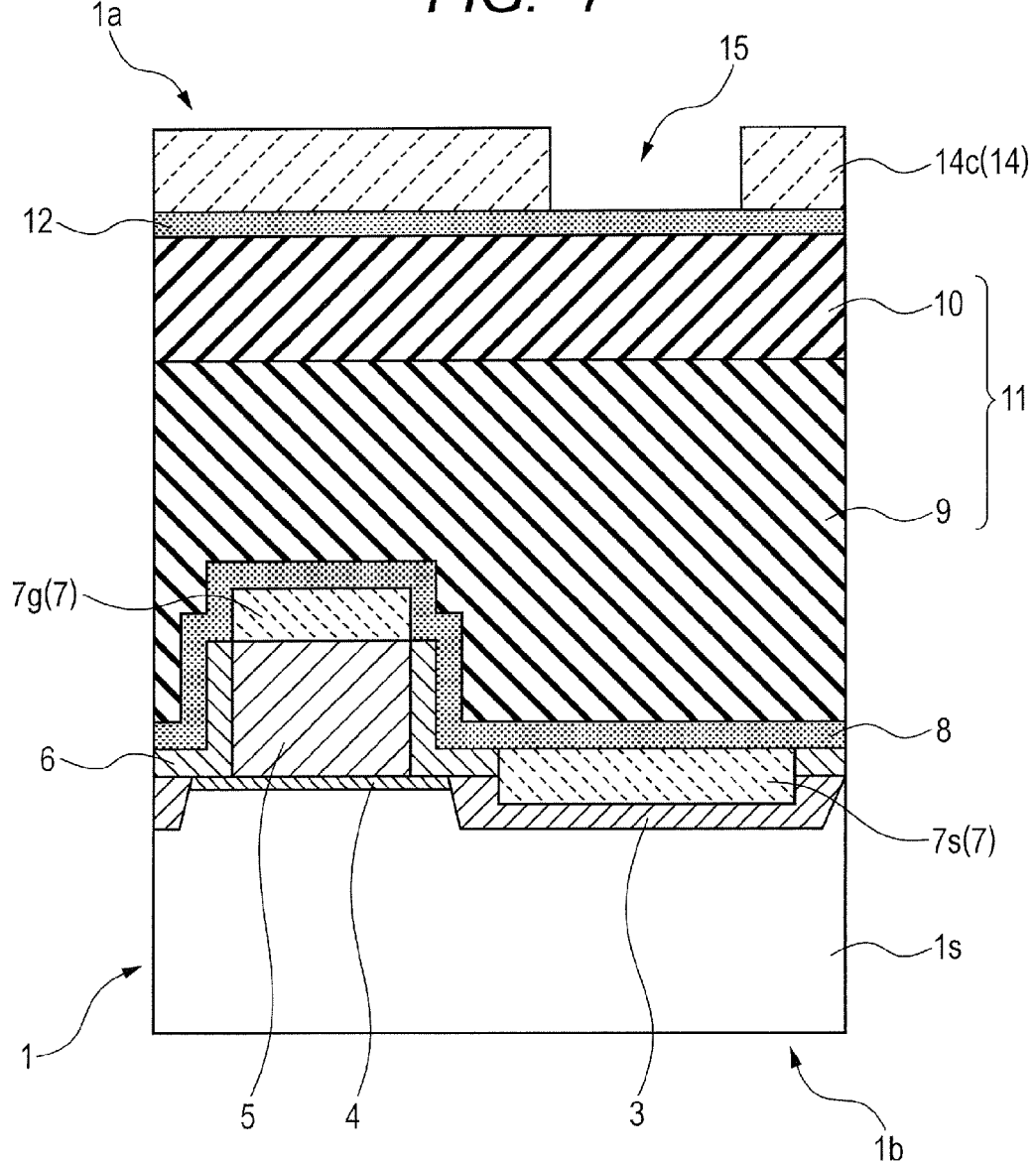
FIG. 7 is a wafer fragmentary cross-sectional view during a wafer process (to obtain a lower carbon-rich film processing step) for describing the main-part process in the method of manufacturing a semiconductor integrated circuit device according to First Embodiment of the present application.
Figure 8:
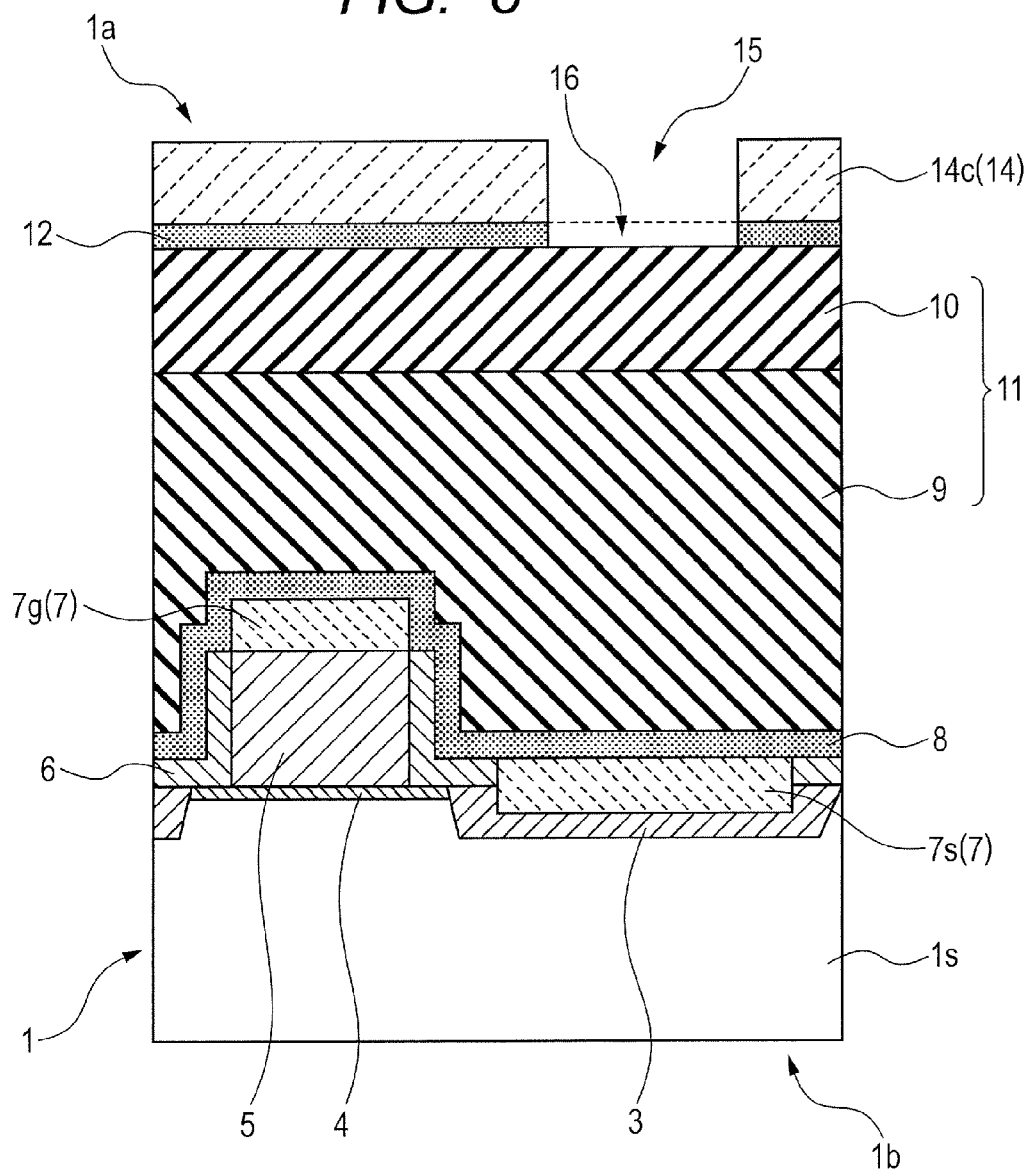
FIG. 8 is a wafer fragmentary cross-sectional view during a wafer process (a step of forming a through-hole in the underlying silicon nitride film of multilayer resist film) for describing the main-part process in the method of manufacturing a semiconductor integrated circuit device according to First Embodiment of the present application.
Figure 9:
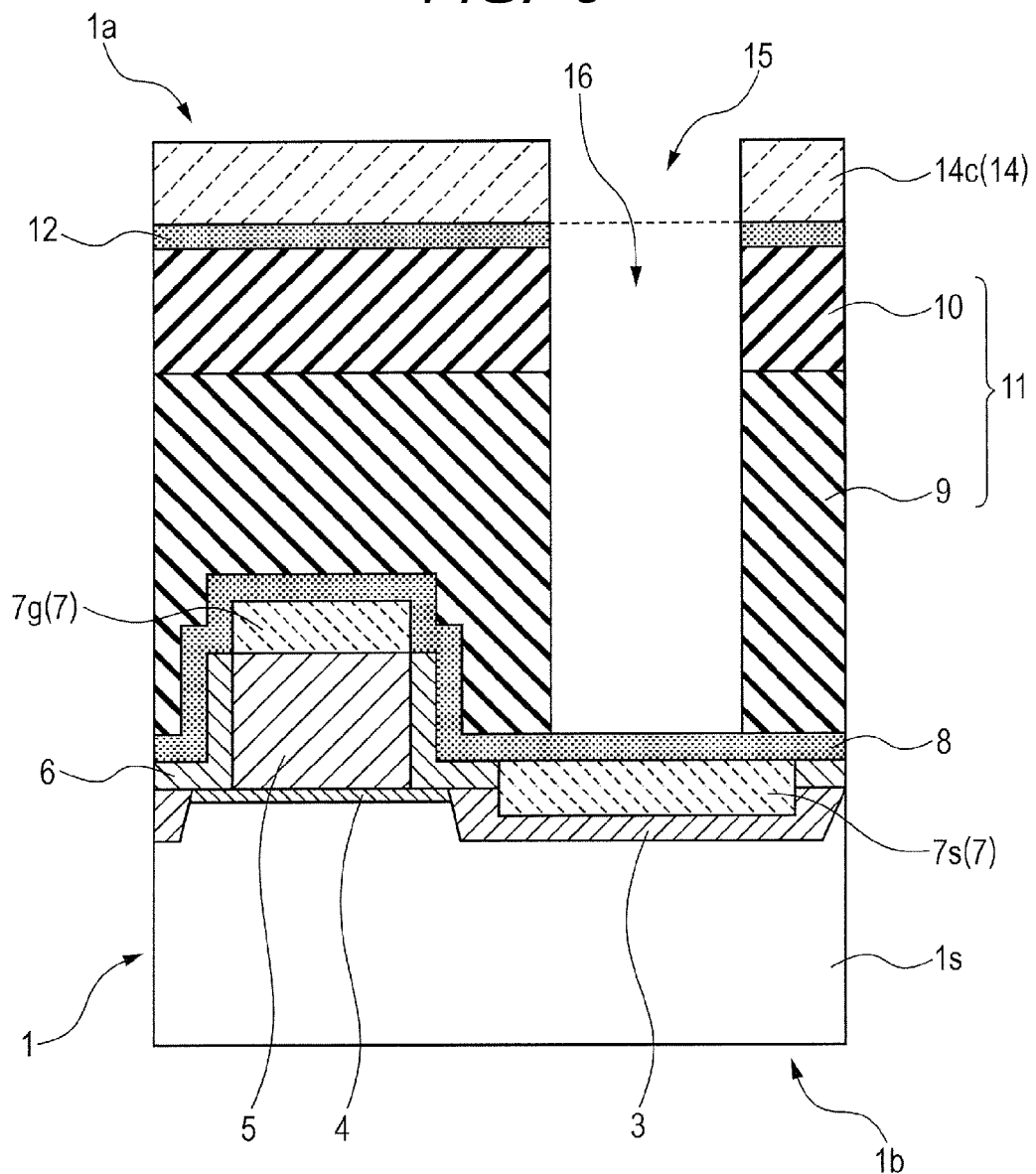
FIG. 9 is a wafer fragmentary cross-sectional view during a wafer process (a step of extending the through-hole to the lower surface of a silicon oxide-based insulating film) for describing the main-part process in the method of manufacturing a semiconductor integrated circuit device according to First Embodiment of the present application.
Figure 10:
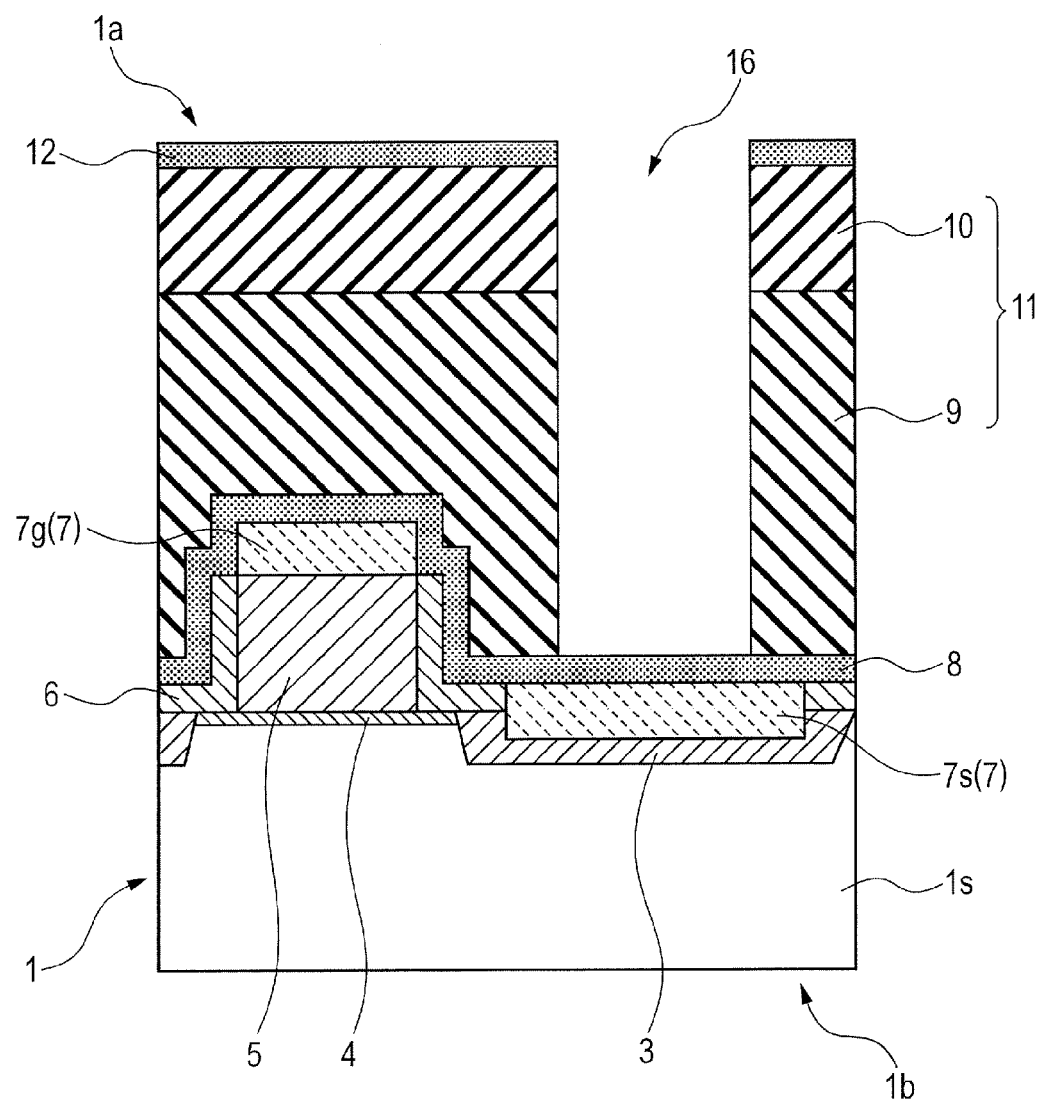
FIG. 10 is a wafer fragmentary cross-sectional view during a wafer process (a carbon-rich film removal step) for describing the main-part process in the method of manufacturing a semiconductor integrated circuit device according to First Embodiment of the present application.
Figure 11:
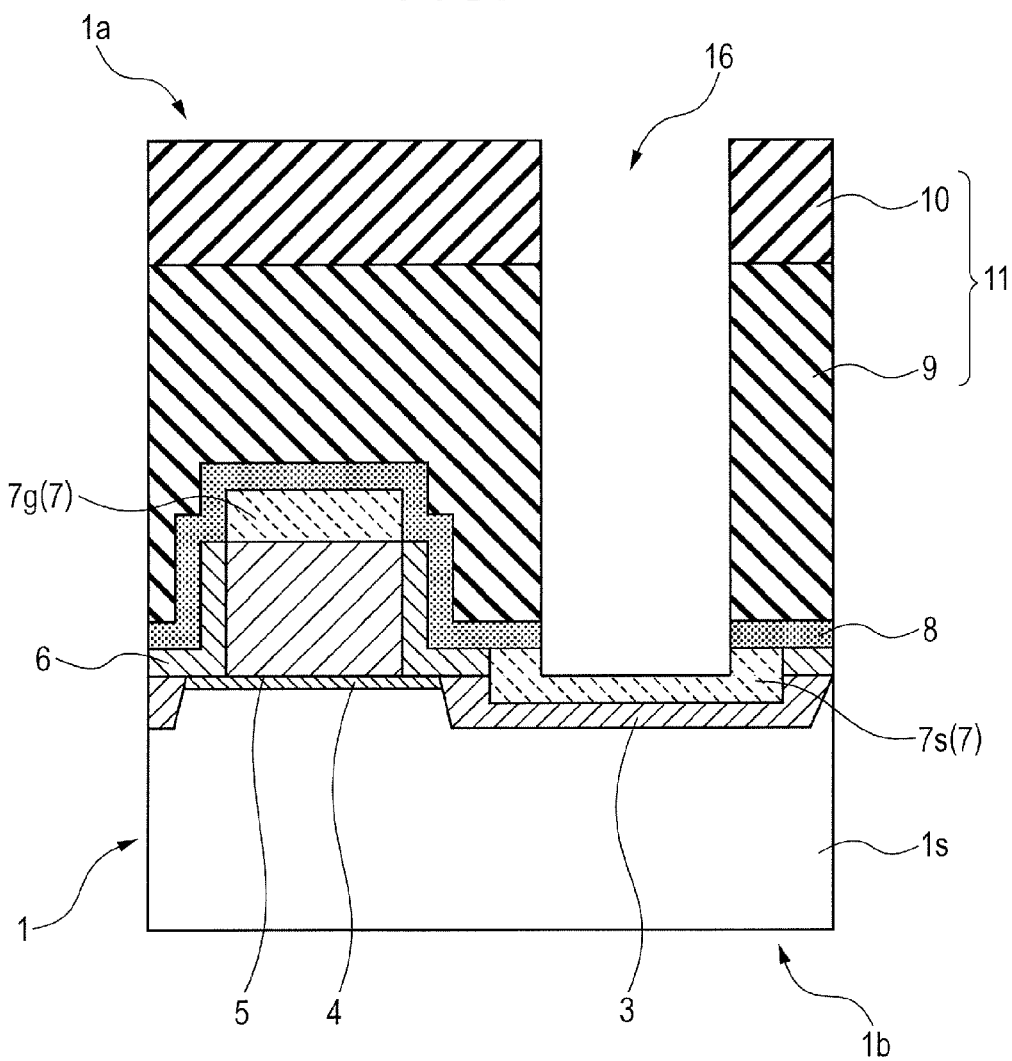
FIG. 11 is a wafer fragmentary cross-sectional view during a wafer process (a silicon nitride film removal step) for describing the main-part process in the method of manufacturing a semiconductor integrated circuit device according to First Embodiment of the present application.
Figure 12:
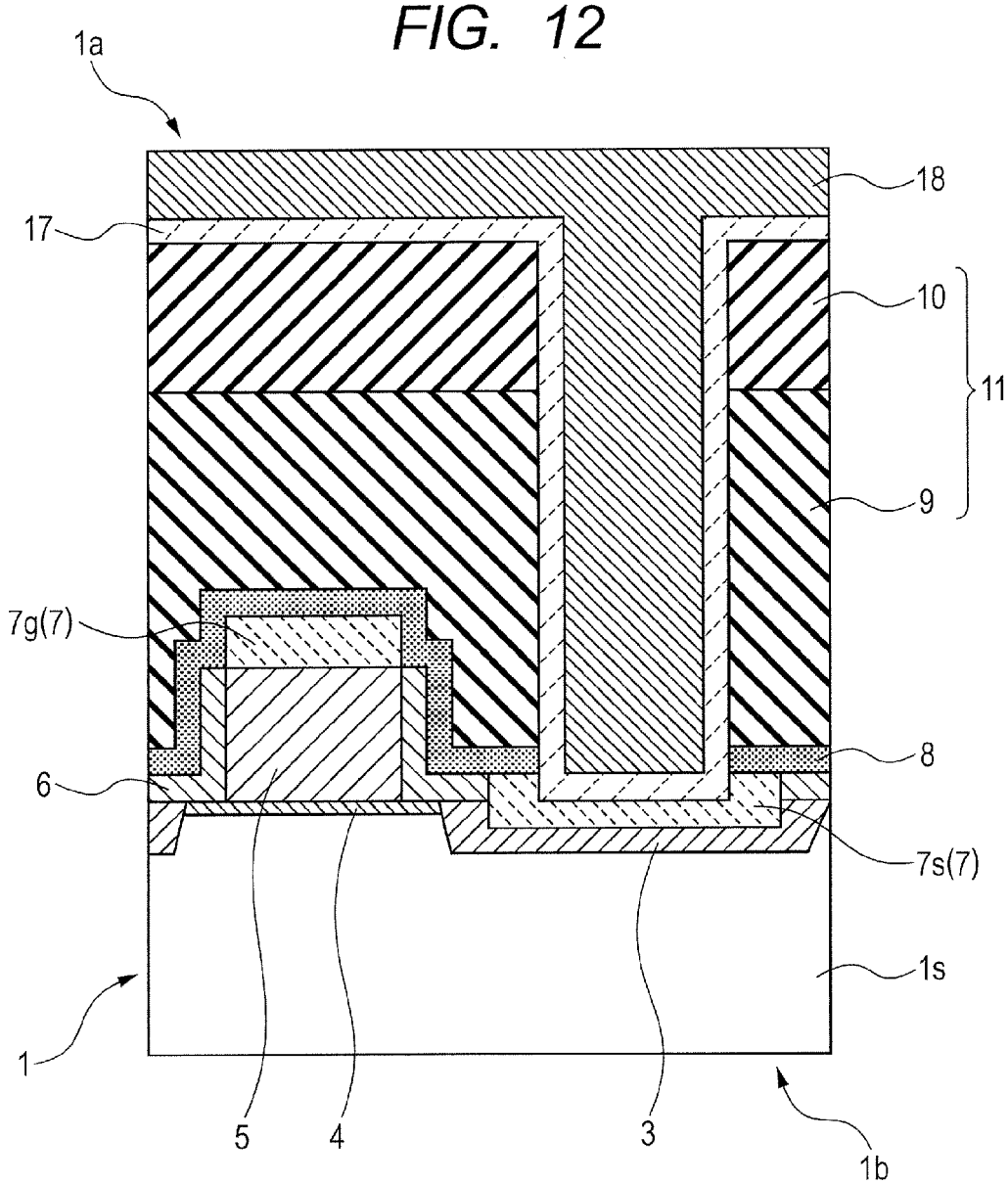
FIG. 12 is a wafer fragmentary cross-sectional view during a wafer process (a contact plug formation step) for describing the main-part process in the method of manufacturing a semiconductor integrated circuit device according to First Embodiment of the present application.
Figure 13:
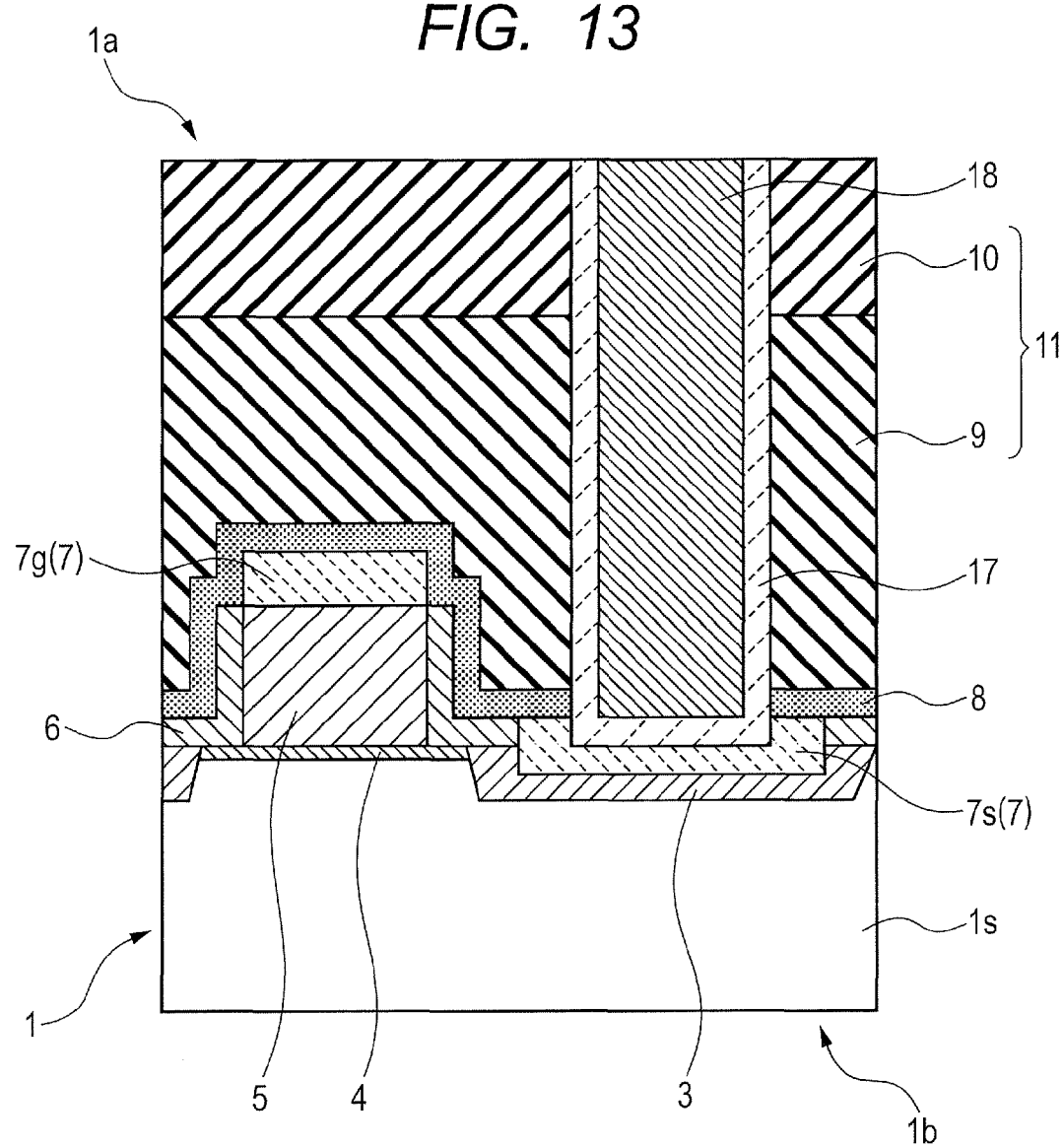
FIG. 13 is a wafer fragmentary cross-sectional view during a wafer process (a contact plug CMP step) for describing the main-part process in the method of manufacturing a semiconductor integrated circuit device according to First Embodiment of the present application.
Figure 14:
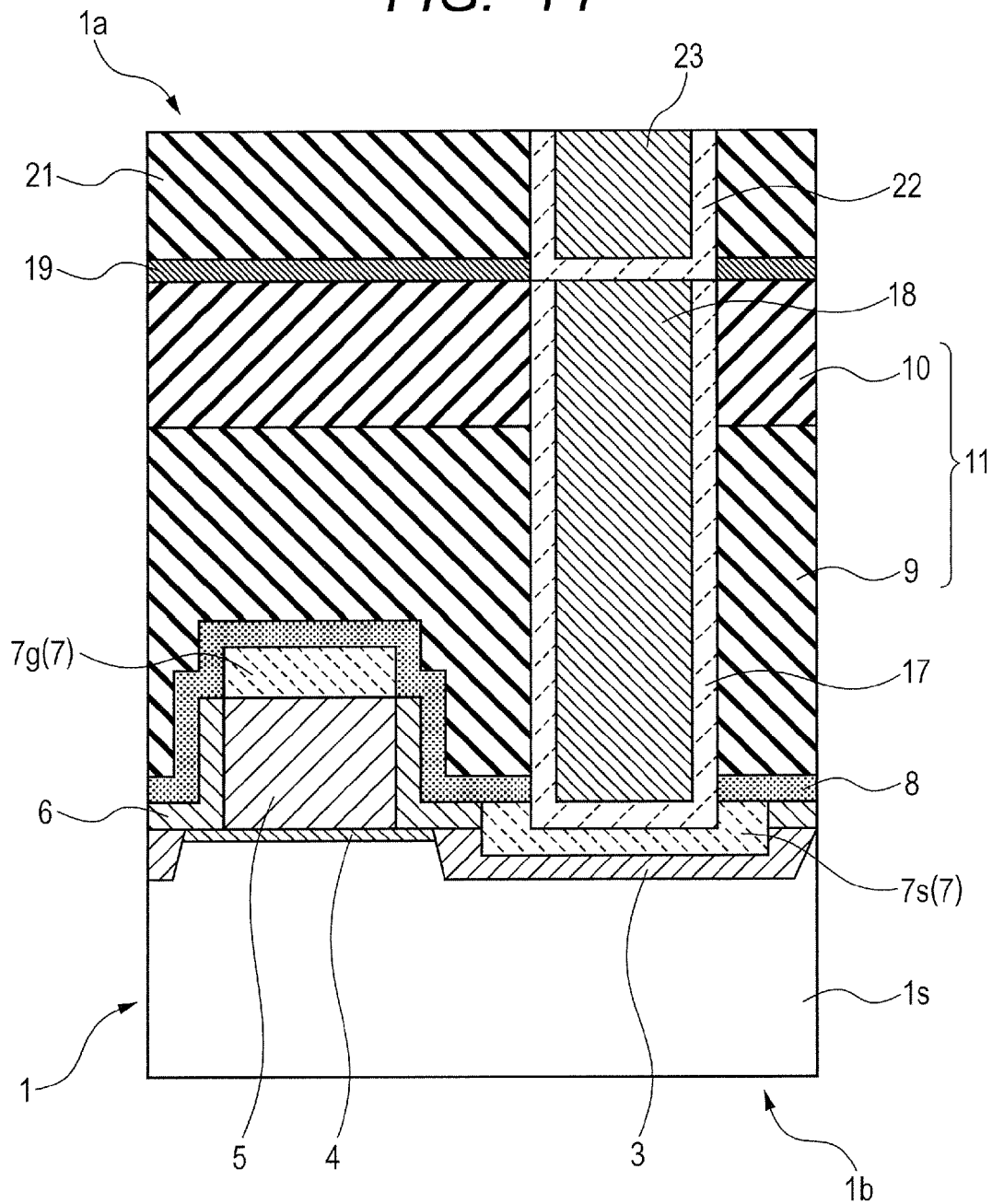
FIG. 14 is a wafer fragmentary cross-sectional view during a wafer process (a first-layer buried wiring formation step) for describing the main-part process in the method of manufacturing a semiconductor integrated circuit device according to First Embodiment of the present application.

FIG. 2 is a block flow chart of a main part wafer process for describing a main-part process in the method of manufacturing a semiconductor integrated circuit device according to First Embodiment of the present application. FIG. 3 is a wafer fragmentary cross-sectional view during a wafer process (an underlying silicon nitride film formation step) for describing the main-part process in the method of manufacturing a semiconductor integrated circuit device according to First Embodiment of the present application. FIG. 4 is a wafer fragmentary cross-sectional view during a wafer process (a multilayer resist application step) for describing the main-part process in the method of manufacturing a semiconductor integrated circuit device according to First Embodiment of the present application. FIG. 5 is a wafer fragmentary cross-sectional view during a wafer process (a photosensitive resist film processing step) for describing the main-part process in the method of manufacturing a semiconductor integrated circuit device according to First Embodiment of the present application. FIG. 6 is a wafer fragmentary cross-sectional view during a wafer process (an intermediate silicon-containing film processing step) for describing the main-part process in the method of manufacturing a semiconductor integrated circuit device according to First Embodiment of the present application. FIG. 7 is a wafer fragmentary cross-sectional view during a wafer process (a lower carbon-rich film processing step) for describing the main-part process in the method of manufacturing a semiconductor integrated circuit device according to First Embodiment of the present application. FIG. 8 is a wafer fragmentary cross-sectional view during a wafer process (a step of forming a through-hole in the underlying silicon nitride film of multilayer resist film) for describing the main-part process in the method of manufacturing a semiconductor integrated circuit device according to First Embodiment of the present application. FIG. 9 is a wafer fragmentary cross-sectional view during a wafer process (a step of extending the through-hole to the lower surface of a silicon oxide-based insulating film) for describing the main-part process in the method of manufacturing a semiconductor integrated circuit device according to First Embodiment of the present application. FIG. 10 is a wafer fragmentary cross-sectional view during a wafer process (a carbon-rich film removal step) for describing the main-part process in the method of manufacturing a semiconductor integrated circuit device according to First Embodiment of the present application. FIG. 11 is a wafer fragmentary cross-sectional view during a wafer process (a silicon nitride film removal step) for describing the main-part process in the method of manufacturing a semiconductor integrated circuit device according to First Embodiment of the present application. FIG. 12 is a wafer fragmentary cross-sectional view during a wafer process (a contact plug formation step) for describing the main-part process in the method of manufacturing a semiconductor integrated circuit device according to First Embodiment of the present application. FIG. 13 is a wafer fragmentary cross-sectional view during a wafer process (a contact plug CMP step) for describing the main-part process in the method of manufacturing a semiconductor integrated circuit device according to First Embodiment of the present application. FIG. 14 is a wafer fragmentary cross-sectional view during a wafer process (a first-layer buried wiring formation step) for describing the main-part process in the method of manufacturing a semiconductor integrated circuit device according to First Embodiment of the present application. Based on these drawings, the main-part process in the method of manufacturing a semiconductor integrated circuit device according to First Embodiment of the present application will be described.

Based on FIGS. 2 and 3, one example of a device structure formed by a process performed prior to a contact process will be described. As shown in FIG. 3, for example, a P type single crystal silicon semiconductor substrate portion 1s of a semiconductor wafer 1 has, on the side of a surface 1a (first main surface) thereof, the device structure. This means that the semiconductor substrate portion 1s has, on the surface 1a thereof, a source/drain region 3 (for example, an N+ type source/drain region) and the semiconductor substrate portion 1s has, in the surface 1a between the source/drain region 3, a gate insulating film 4 (for example, a tunnel insulating film of a flash memory element). The gate insulating film 4 has a gate electrode 5 and the gate electrode has therearound a sidewall insulating film 6. The source/drain region 3 has, on the surface thereof, and the gate electrode 5 has, on the upper surface thereof, silicide films 7 (for example, nickel platinum silicide films), respectively.

The surface 1a of the semiconductor substrate portion is including the above-mentioned structure has thereover, as an etch stop film, for example, a relatively thin substrate-surface silicon nitride-based insulating film 8 (first silicon nitride-based insulating film) (a silicon nitride-based insulating film formation step 101 in FIG. 2). This substrate-surface silicon nitride-based insulating film 8 (for example, silicon nitride film) has thereon, for example, a lower premetal silicon oxide-based insulating film 9 (for example, ozone TEOS silicon oxide film) which is thicker (for example, about 300 nm) than the substrate-surface silicon nitride-based insulating film. The lower premetal silicon oxide-based insulating film 9 has thereon an upper premetal silicon oxide-based insulating film 10 (for example, plasma TEOS silicon oxide film) which is thicker (for example, about 300 nm) than the substrate-surface silicon nitride-based insulating film 8. In this example, the thickness of the upper premetal silicon oxide-based insulating film 10 is adjusted finally to for example, about 100 nm, if necessary, by a film thinning treatment such as CMP or dry etchback and additional CVD treatment (for example, formation of an additional plasma TEOS silicon oxide film) based on a film thickness test after the film thinning treatment (a silicon oxide-based insulating film formation step 102 in FIG. 2). In this example, the lower premetal silicon oxide-based insulating film 9 and the upper premetal silicon oxide-based insulating film 10 configure a premetal silicon oxide-based insulating film 11 (first silicon oxide-based insulating film). The premetal silicon oxide-based insulating film 11 is not necessarily comprised of two layers. It may be a single layer or comprised of three or more layers. It is however needless to say that none of CMP, dry etchback, film thinning treatment, film thickness test, additional CVD treatment, and the like is essential.

Next, as shown in FIG. 3, an underlying silicon nitride-based insulating film 12 (second silicon nitride-based insulating film) of multilayer resist film is formed on the premetal silicon oxide-based insulating film 11, for example, by CVD (a silicon nitride-based insulating film formation step 103 in FIG. 2). As the underlying silicon nitride-based insulating film 12 of multilayer resist film, for example, a silicon nitride film having a refractive index of, for example, about 2.2 to a light having a wavelength of 680 nm and having a film thickness of, for example, about 25 nm is preferred.

Next, as shown in FIG. 4, a carbon-rich film 14c (for example, about 200 nm thick) as a lower film configuring a three-layer resist film is applied to the underlying silicon nitride-based insulating film 12 of multilayer resist film by spin coating or the like method (a carbon-rich film application step 104 in FIG. 2). Then, crosslinking heat treatment (for example, for about 90 seconds at 250° C.) is performed as needed. The carbon-rich film 14c is preferably an organic polymer-based coating film containing carbon as a main component and not containing silicon as a main component (a silicon-free one is most preferred but that containing a small amount of silicon is not excluded).

Next, a silicon-containing film 14s (for example, about 80 nm thick) is applied onto the carbon-rich film 14c by spin coating or the like method (a silicon-containing film application step 105 in FIG. 2). Then, a crosslinking heat treatment (for example, for about 90 seconds at 250° C.) is performed as needed. As an example of the silicon-containing film 14s, an organic polymer-based coating film (for example, an organic polymer-based coating member containing polysiloxane or the like) containing carbon and silicon as main components thereof is preferred.

Next, a photoresist film 14p (for example, about 200 nm thick) is applied onto the silicon-containing film 14s, for example, by spin coating or the like (a photoresist film application step 106 in FIG. 2). Then, heat treatment for vaporizing a solvent, that is, a prebake treatment (for example, for about 60 seconds at 100° C.) is carried out as needed. Preferred examples of the photoresist film 14p include a top coat less positive chemical amplification resist film for ArF exposure and the like. Thus, in this example, the multilayer resist film 14 is comprised of a three-layer stacked film of the carbon-rich film 14c, silicon-containing film 14s, and photoresist film 14p.

Then, reduction projection exposure is performed (a reduction projection exposure step 107) as described in Section 1, followed by PEB (post exposure bake) if necessary, for example, for about 60 seconds at 100° C.

Next, as shown in FIG. 5, development is performed, for example, with an alkaline developer for about 30 seconds to pattern the photoresist film 14p, in other words, to process the photoresist film 14p to form a resist film opening 15 therein.

Next, with the processed photoresist film 14p as a mask, the pattern of the photoresist film 14p is transferred to the silicon-containing film 14s by carrying out an etching treatment such as dry etching, for example, anisotropic dry etching such as RIE (reactive ion etching). At the time of completion of this transfer, the photoresist film 14p has usually disappeared as shown in FIG. 6 (this condition is of course dispensable). As the etching condition, the following example is preferred: etching gas: $CF_4$ (flow rate, for example, at about 150 sccm), wafer stage preset temperature: about 60° C., and pressure in a treatment chamber: about 15 Pa.

Next, with the processed silicon-containing film 14s as a mask, the pattern of the silicon-containing film 14s is transferred to the carbon-rich film 14c by carrying out an etching treatment such as dry etching, for example, anisotropic dry etching such as RIE. At the time of completion of this transfer, the silicon-containing film 14s has usually disappeared as shown in FIG. 7 (this condition is of course dispensable). As the etching condition, the following example is preferred: etching gas: $H_2/N_2$ (flow rate, for example, at about 100 sccm/300 sccm), wafer stage preset temperature: about 60° C., and pressure in a treatment chamber: about 15 Pa. The multilayer resist film processing step 108 in FIG. 2 thus ranges from a step of developing the photoresist film 14p to a step of successively transferring the opening-containing pattern to the multilayer resist film lying therebelow.

Next, as shown in FIG. 8, with the carbon-rich film 14c as a mask, a through-hole 16 corresponding to the resist film opening 15 of the carbon-rich film 14c is formed in the underlying silicon nitride-based insulating film 12 (second silicon nitride-based insulating film) of multilayer resist film by carrying out an etching treatment such as dry etching, for example, anisotropic dry etching such as RIE. This step is an underlying film through-hole formation step 109 (first dry etching step) shown in FIG. 2. As the etching condition, the following example is preferred: etching gas: $CF_4$ (flow rate, for example at about 150 sccm), wafer stage preset temperature: about 60° C., and pressure in a treatment chamber: about 15 Pa.

Next as shown in FIG. 9, with the carbon-rich film 14c as a mask, the through-hole 16 formed in the underlying silicon nitride-based insulating film 12 of multilayer resist film is extended to the lower surface of the premetal silicon oxide-based insulating film 11 (first silicon oxide-based insulating film) by carrying out an etching treatment such as dry etching, for example, anisotropic dry etching such as RIE. As the etching condition, the following example is preferred: etching gas: $C_4F_6/Ar/O_2$ (flow rate, for example, at about 20 sccm/500 sccm/20 sccm), wafer stage preset temperature: about 60° C., and pressure in a treatment chamber: about 15 Pa. This is a through-hole extension step 110 (second dry etching step) shown in FIG. 2.

Next, the remaining carbon-rich film 14c is removed, for example, by ashing or the like (a carbon-rich film removal step 111 in FIG. 2) as shown in FIG. 10.

Next, under the state of FIG. 10, an etching treatment such as dry etching, for example, anisotropic dry etching such as RIE is carried out. By this treatment, the substrate-surface silicon nitride-based insulating film 8 (first silicon nitride-based insulating film) on the bottom of the through-hole 16, that is, the contact hole, and the underlying silicon nitride-based insulating film 12 (second silicon nitride-based insulating film) of multilayer resist film outside the contact hole are removed (silicon nitride-based insulating film removal step 112 shown in FIG. 2) as shown in FIG. 11. As the etching condition, the following example is preferred: etching gas: $CHF_3/Ar/O_2$ (flow rate, for example, at about 20 sccm/800 sccm/20 sccm), wafer stage preset temperature: about 60° C., and pressure in a treatment chamber: about 3 Pa.

All the treatments (including ashing) from the step of transferring the pattern of the photoresist film 14p to the silicon-containing film 14s described referring to FIG. 5 to the silicon nitride-based insulating film removal step described referring to FIGS. 10 and 11 are carried out on the same wafer stage of the same treatment chamber (which will hereinafter be called "multilayer film in situ gas phase treatment"). In situ treatment is not essential but, it can drastically improve the treatment efficiency. In this example, the wafer stage preset temperature is set at almost the same temperature (the term "almost the same temperature" means a temperature falling within a range of several degrees centered at the preset temperature) during the multilayer film in situ gas phase treatment (including ashing). Keeping the wafer stage preset temperature at almost the same temperature is not necessary but has the merit of decreasing the treatment time.

Next, as shown in FIG. 12, for example, a titanium-based barrier metal film 17 (a barrier metal film based on another material may be used as needed). Preferred examples of the titanium-based barrier metal film 17 include a stacked film comprised of a lower titanium film and an upper titanium nitride film. The titanium film is formed preferably, for example, by IMP (ionized metal plasma) sputtering, while the titanium nitride film is formed preferably, for example, by MOCVD (metal organic chemical vapor deposition). As well as the above-mentioned method, another sputtering method, CVD, ALD (atomic layer deposition), and the like can be employed for the formation of the titanium-based barrier metal film 17.

Further, a tungsten film 18 is formed inside and outside the contact hole, for example, by CVD so as to fill the contact hole therewith. Then, the tungsten film 18 and the titanium-based barrier metal film 17 outside the contact hole are removed, for example, by CMP (chemical mechanical polishing) to complete the formation of a tungsten plug 18 as shown in FIG. 13.

Next, as shown in FIG. 14, for example, a silicon nitride-based insulating barrier film 19 is formed on the premetal silicon oxide-based insulating film 11, followed by the formation thereon of, for example, a first-layer wiring interlayer silicon oxide-based insulating film 21. In a first-layer interlayer insulating film comprised of the first-layer wiring interlayer silicon oxide-based insulating film 21, the silicon nitride-based insulating barrier film 19, and the like, a wiring trench or the like is formed using, for example, typical lithography and in the trench, a metal buried wiring comprised of, for example, a tantalum-based barrier metal film 22, a first-layer copper-based buried wiring 23, and the like is formed. As the barrier metal film, not only a tantalum-based one but also a barrier metal film based on another material such as titanium or ruthenium can be used.

After that, such a process is repeated, a required number of wiring layers is stacked as needed, and a pad layer is formed thereon as needed. Then, a final passivation film and the like are formed. After a wafer test and the like, the wafer 1 is divided into individual chips by dicing or the like, and then packaging is carried out as needed.

3. Description on the Modified Main-Part Process in the Method of Manufacturing a Semiconductor Integrated Circuit Device According to First Embodiment of the Present Application (Mainly from FIGS. 15 to 21)

Figure 21:
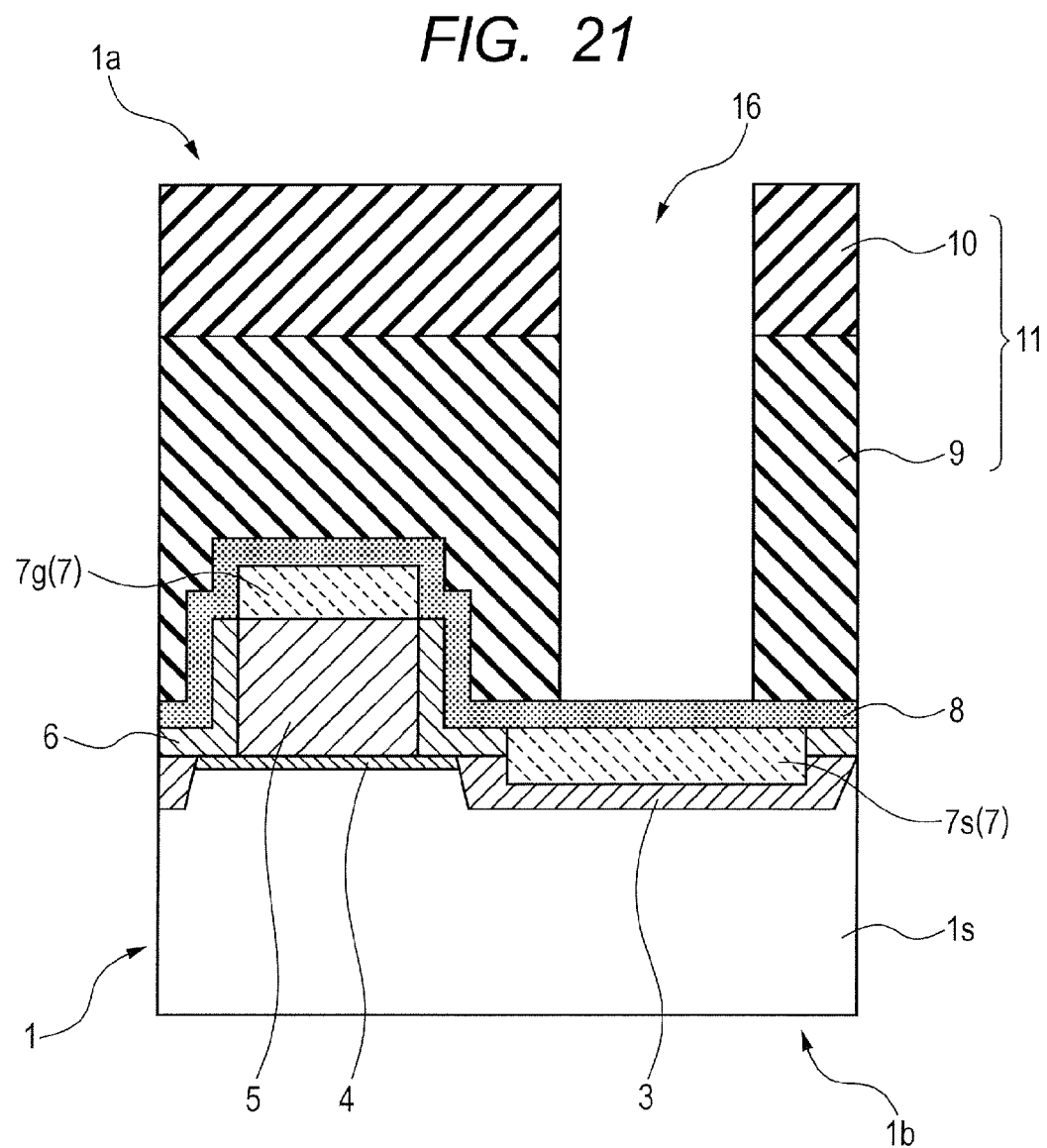
FIG. 21 is a wafer fragmentary cross-sectional view during a wafer process (a carbon-rich film removal step) for describing the main-part process of the modification example in the method of manufacturing a semiconductor integrated circuit device according to First Embodiment of the present application.

The process which will be described in this section is a modification example of the process described in Sections 1 and 2 so that only a difference between them will hereinafter be described. For example, FIG. 21 corresponds to FIG. 10 and the process after FIG. 21 is basically same as that described referring to FIGS. 11 to 14 so that an overlapping description will be omitted in principle.

Figure 15:
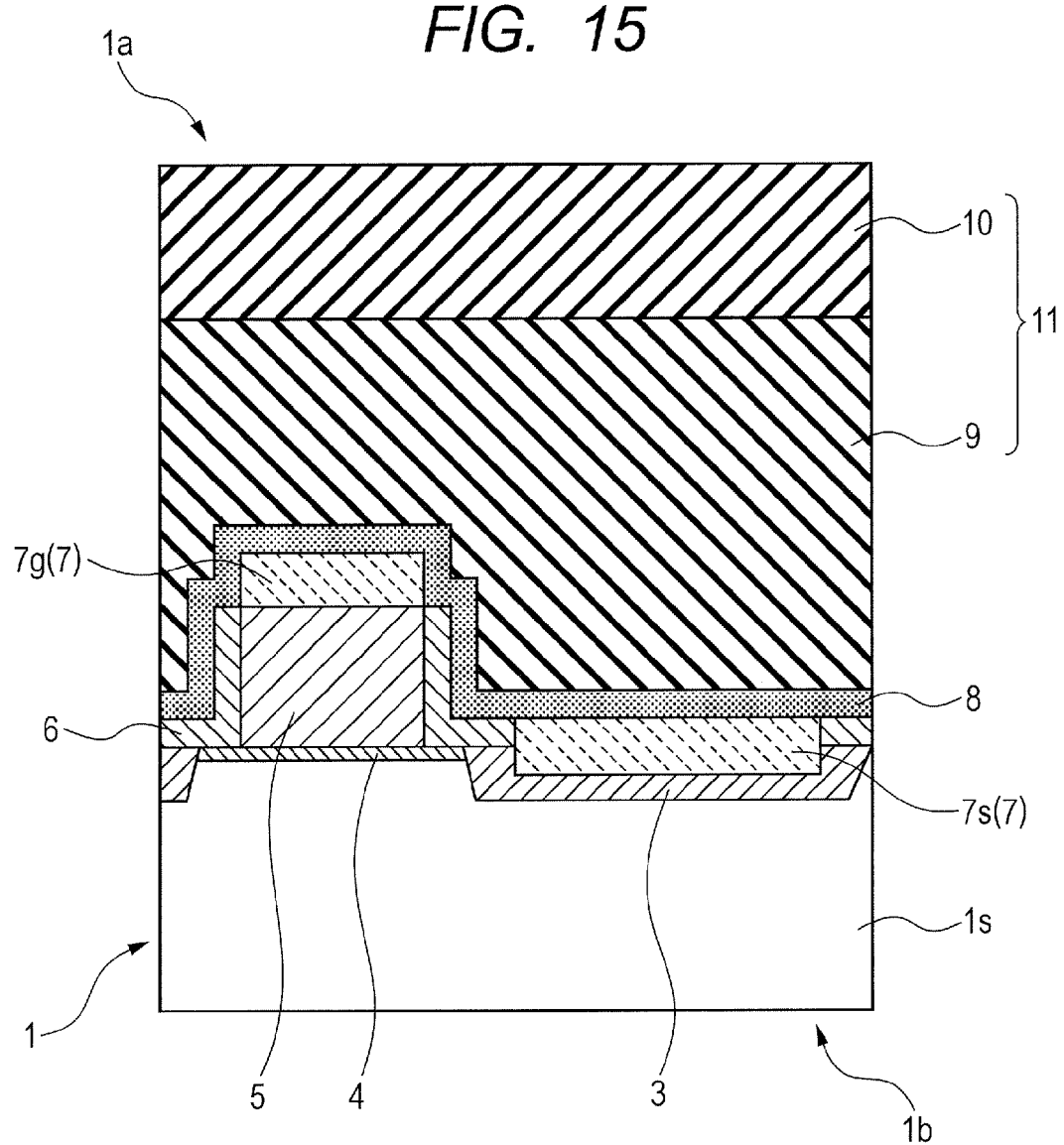
FIG. 15 is a wafer fragmentary cross-sectional view during a wafer process (an upper premetal silicon oxide-based insulating film formation step) for describing the main-part process of a modification example in the method of manufacturing a semiconductor integrated circuit device according to First Embodiment of the present application.
Figure 16:
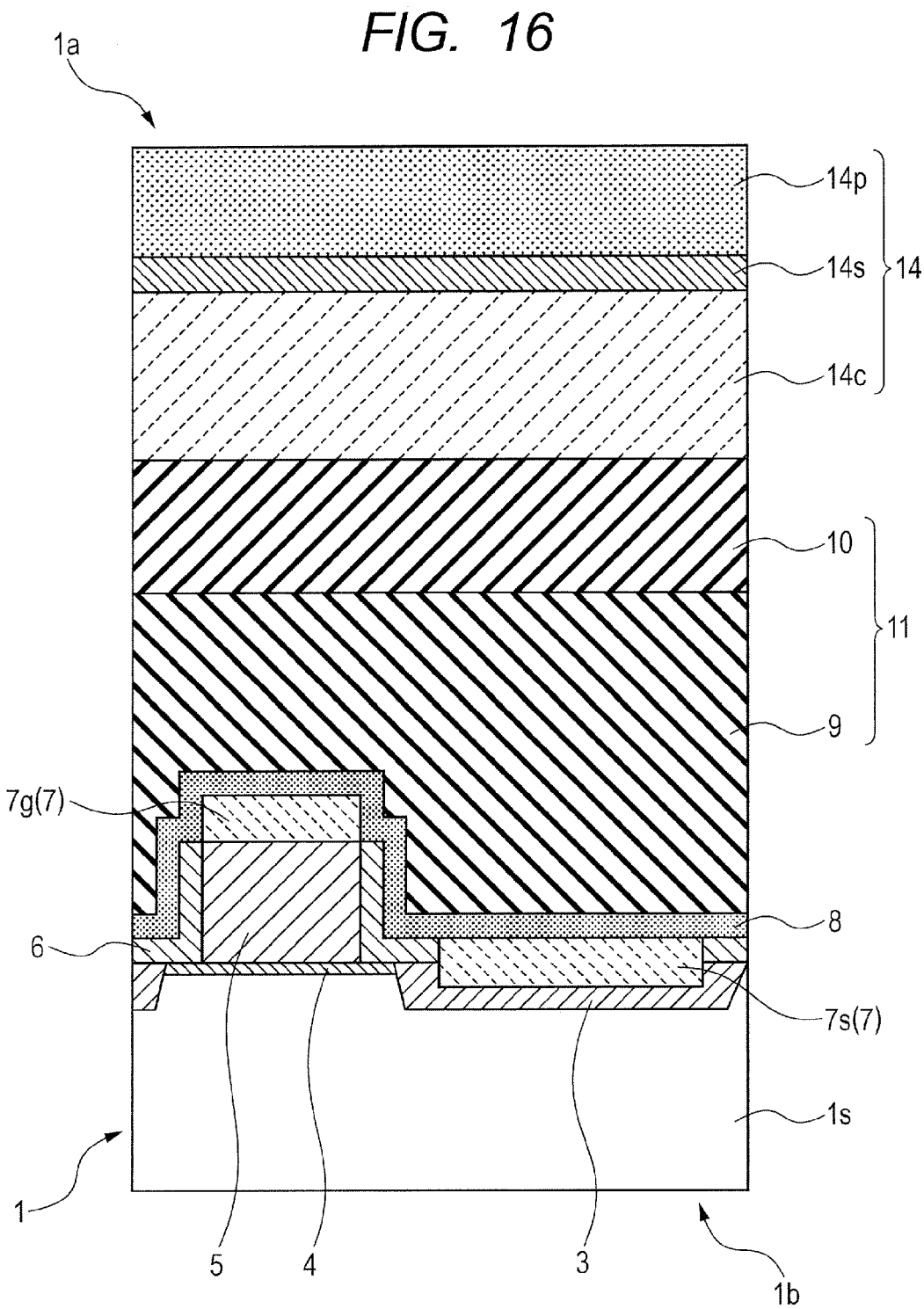
FIG. 16 is a wafer fragmentary cross-sectional view during a wafer process (a multilayer resist application step) for describing the main-part process of the modification example in the method of manufacturing a semiconductor integrated circuit device according to First Embodiment of the present application.
Figure 17:
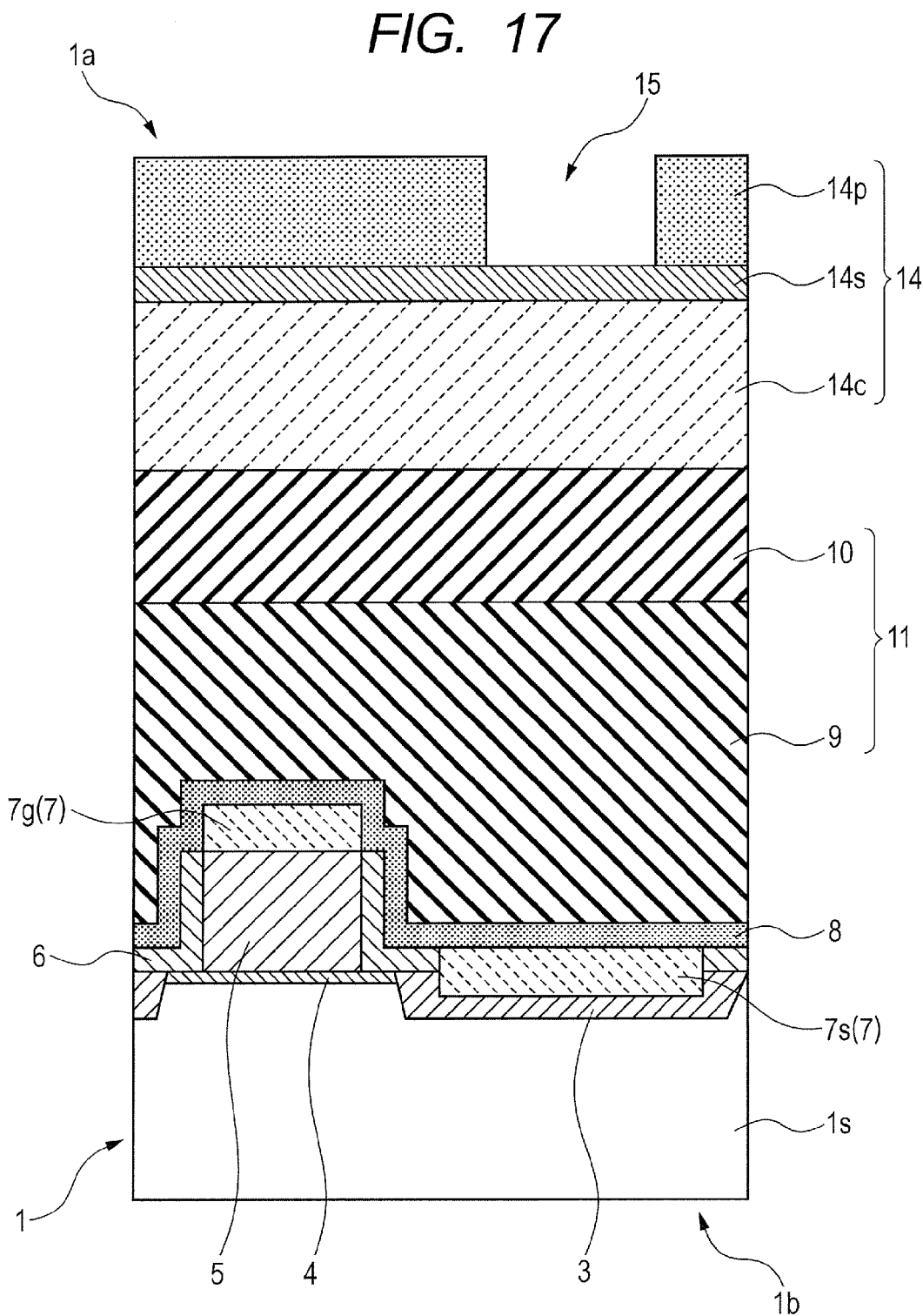
FIG. 17 is a wafer fragmentary cross-sectional view during a wafer process (a photosensitive resist film processing step) for describing the main-part process of the modification example of the method of manufacturing a semiconductor integrated circuit device according to First Embodiment of the present application.
Figure 18:
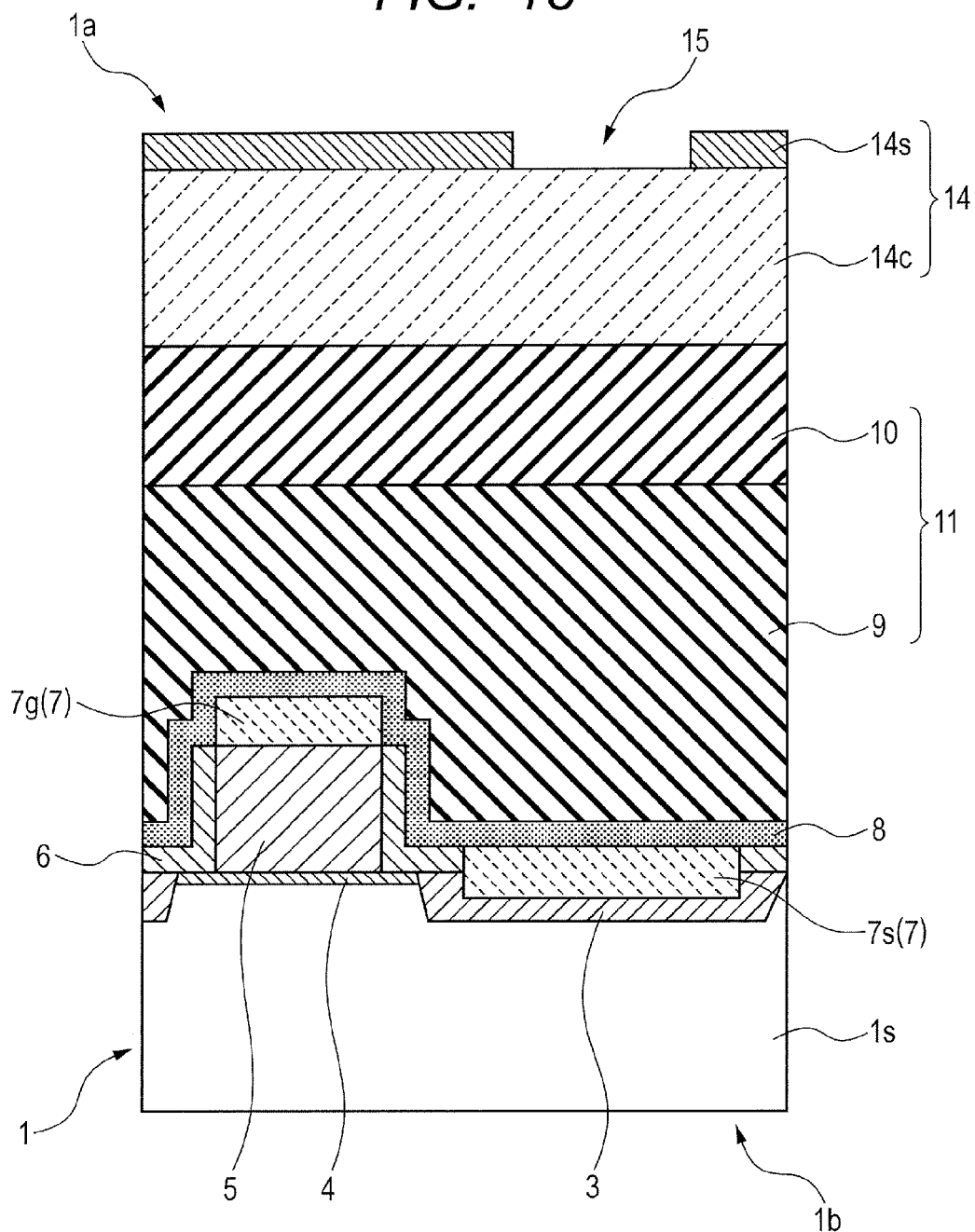
FIG. 18 is a wafer fragmentary cross-sectional view during a wafer process (an intermediate silicon-containing film processing step) for describing the main-part process of the modification example of the method of manufacturing a semiconductor integrated circuit device according to First Embodiment of the present application.
Figure 19:
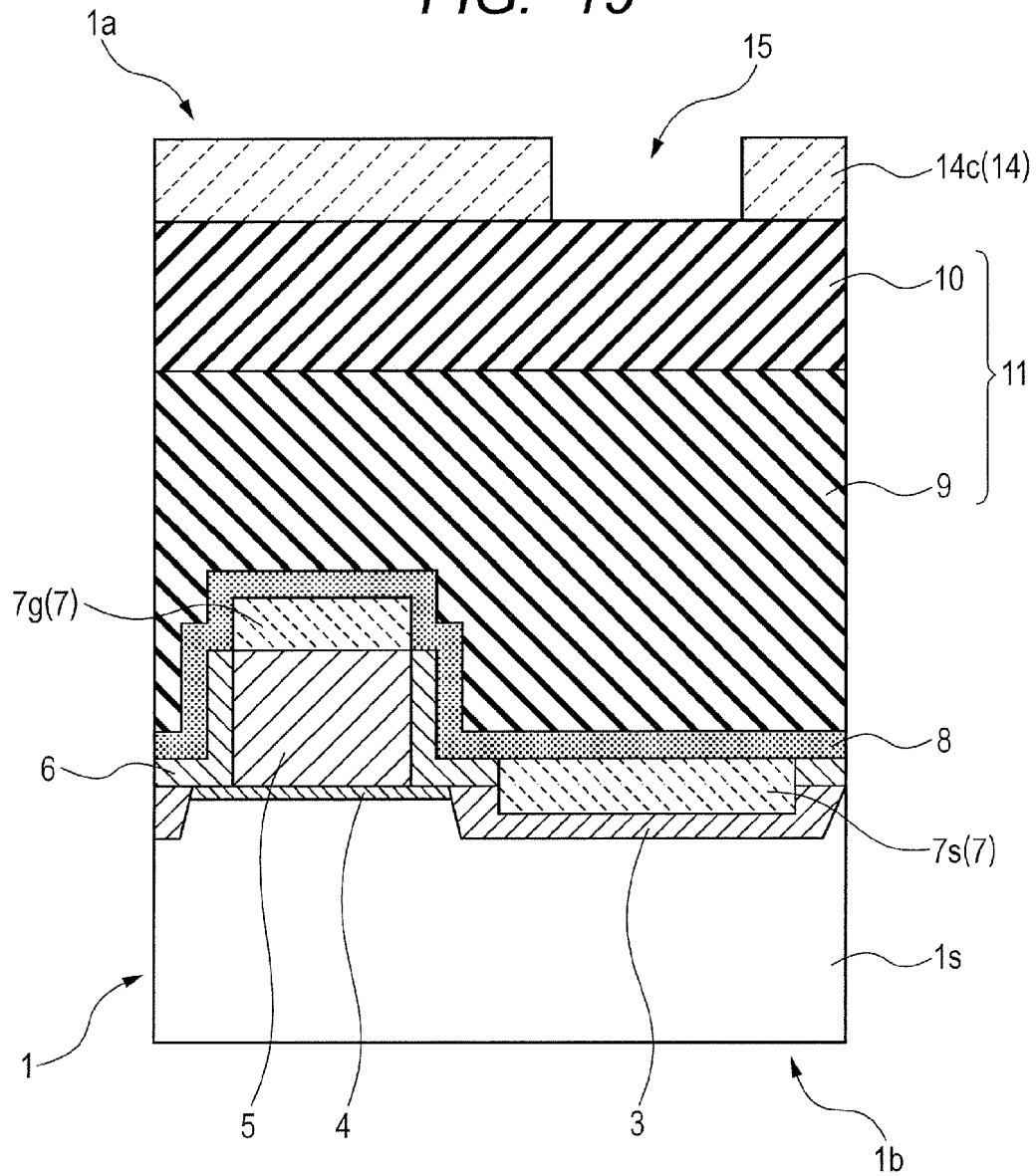
FIG. 19 is a wafer fragmentary cross-sectional view during a wafer process (a lower carbon-rich film processing step) for describing the main-part process of the modification example in the method of manufacturing a semiconductor integrated circuit device according to First Embodiment of the present application.
Figure 20:
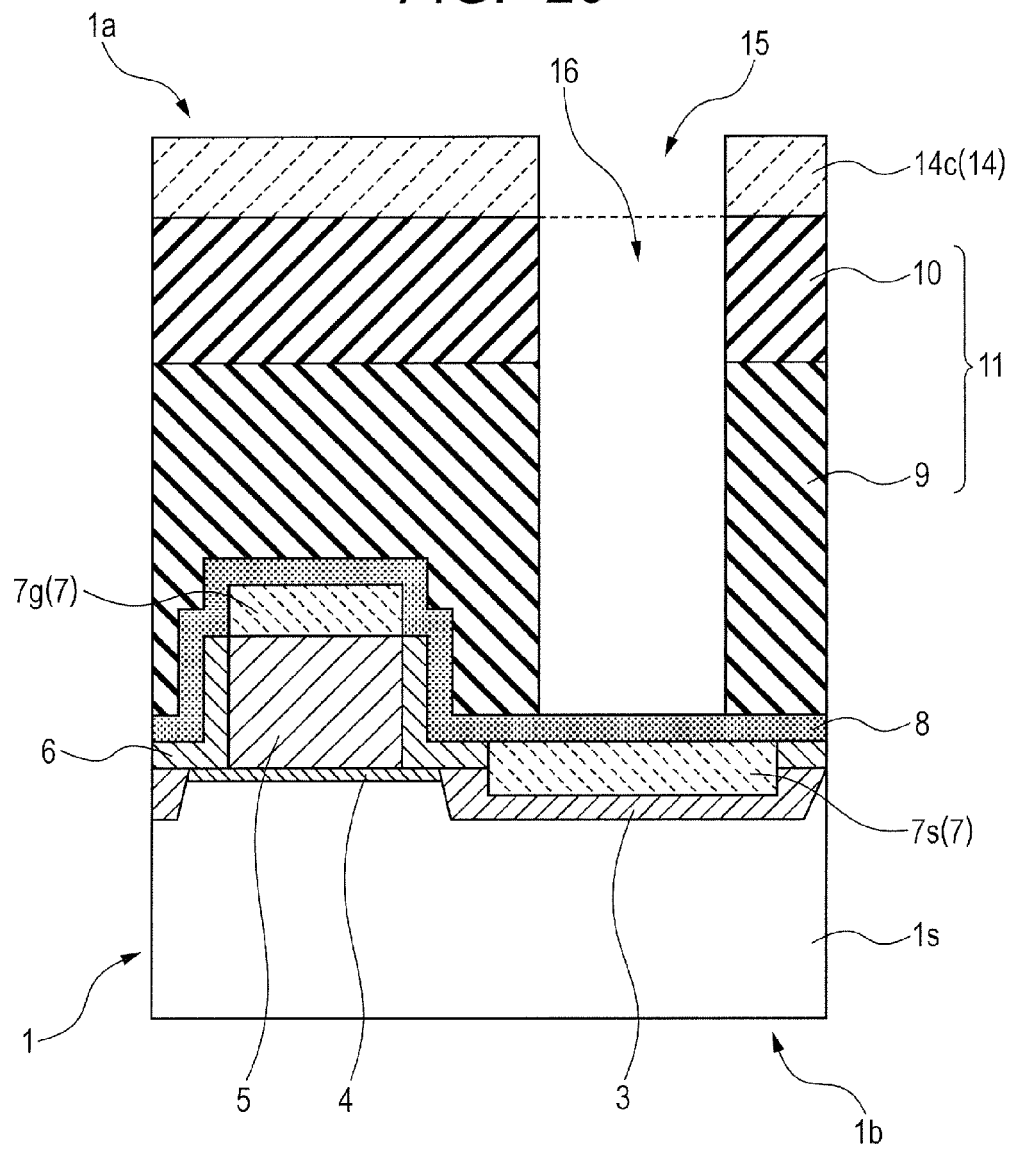
FIG. 20 is a wafer fragmentary cross-sectional view during a wafer process (step of forming a through hole in the silicon oxide-based insulating film) for describing the main-part process of the modification example in the method of manufacturing a semiconductor integrated circuit device according to First Embodiment of the present application.

FIG. 15 is a wafer fragmentary cross-sectional view during a wafer process (an upper premetal silicon oxide-based insulating film formation step) for describing the main-part process of a modification example in the method of manufacturing a semiconductor integrated circuit device according to First Embodiment of the present application. FIG. 16 is a wafer fragmentary cross-sectional view during a wafer process (a multilayer resist application step) for describing the main-part process of the modification example in the method of manufacturing a semiconductor integrated circuit device according to First Embodiment of the present application. FIG. 17 is a wafer fragmentary cross-sectional view during a wafer process (a photosensitive resist film processing step) for describing the main-part process of the modification example of the method of manufacturing a semiconductor integrated circuit device according to First Embodiment of the present application. FIG. 18 is a wafer fragmentary cross-sectional view during a wafer process (an intermediate silicon-containing film processing step) for describing the main-part process of the modification example of the method of manufacturing a semiconductor integrated circuit device according to First Embodiment of the present application. FIG. 19 is a wafer fragmentary cross-sectional view during a wafer process (a lower carbon-rich film processing step) for describing the main-part process of the modification example in the method of manufacturing a semiconductor integrated circuit device according to First Embodiment of the present application. FIG. 20 is a wafer fragmentary cross-sectional view during a wafer process (step of forming a through hole in the silicon oxide-based insulating film) for describing the main-part process of the modification example in the method of manufacturing a semiconductor integrated circuit device according to First Embodiment of the present application. FIG. 21 is a wafer fragmentary cross-sectional view during a wafer process (a carbon-rich film removal step) for describing the main-part process of the modification example in the method of manufacturing a semiconductor integrated circuit device according to First Embodiment of the present application. Based on these drawings, the modified main-part process of the method of manufacturing a semiconductor integrated circuit device according to First Embodiment of the present application will be described.

Similar to Section 2, one example of a device structure formed by a process prior to a contact process will be described referring to FIG. 15. As shown in FIG. 15, for example, a P type single crystal silicon semiconductor substrate portion 1s of a semiconductor wafer 1 has, on the side of a surface 1a (first main surface) thereof, a device structure. This means that the semiconductor substrate portion 1s has, in the surface 1a thereof, a source/drain region 3 (for example, an N+ type source/drain region) and the semiconductor substrate portion 1s has, in the surface 1a between the source/drain region 3, a gate insulating film 4 (for example, a tunnel insulating film of a flash memory element). The gate insulating film 4 has thereon a gate electrode 5 and the gate electrode has therearound a sidewall insulating film 6. The source/drain region 3 has, on the surface thereof, and the gate electrode 5 has, on the upper surface thereof, silicide films 7 (for example, nickel platinum silicide films), respectively.

The surface 1a of the semiconductor substrate portion 1s including the above-mentioned structure has thereover, as an etch stop film, for example, a relatively thin substrate-surface silicon nitride-based insulating film 8 (first silicon nitride-based insulating film). This substrate-surface silicon nitride-based insulating film 8 (for example, silicon nitride film) has thereon, for example, a lower premetal silicon oxide-based insulating film 9 (for example, ozone TEOS silicon oxide film) which is thicker (for example, about 300 nm) than the substrate-surface silicon nitride-based insulating film. The lower premetal silicon oxide-based insulating film 9 has thereon an upper premetal silicon oxide-based insulating film 10 (for example, a plasma TEOS silicon oxide film) which is thicker (for example, about 300 nm) than the substrate-surface silicon nitride-based insulating film 8. In this example, the thickness of the upper premetal silicon oxide-based insulating film 10 is adjusted finally to, for example, about 100 nm, if necessary, by a film thinning treatment such as CMP or dry etchback and an additional CVD treatment (for example, formation of an additional plasma TEOS silicon oxide film) based on a film thickness test after the film thinning treatment. In this example, the lower premetal silicon oxide-based insulating film 9 and the upper premetal silicon oxide-based insulating film 11 configure a premetal silicon oxide-based insulating film 11 (first silicon oxide-based insulating film). The premetal silicon oxide-based insulating film 11 is not necessarily comprised of two layers. It may be comprised of a single layer or three or more layers.

Next, as shown in FIG. 16, a carbon-rich film 14c (for example, about 200 nm thick) is applied onto the premetal silicon oxide-based insulating film 11 as a lower film configuring a three-layer resist film by spin coating or the like method. Then, a crosslinking heat treatment (for example, for about 90 seconds at 250° C.) is performed as needed. The carbon-rich film 14c is preferably an organic polymer-based coating film containing carbon as a main component and not containing silicon as a main component (a silicon free one is most preferred but a film containing a small amount of silicon is not excluded).

Next, a silicon-containing film 14s (for example, about 80 nm thick) is applied onto the carbon-rich film 14, for example, by spin coating. Then, a crosslinking heat treatment (for example, for about 90 seconds at 250° C.) is performed as needed. The silicon-containing film 14s is preferably an organic polymer-based coating film (for example, an organic polymer-based coating member containing polysiloxane or the like) containing carbon and silicon as main components thereof.

Next, a photoresist film 14p (for example, about 200 nm thick) is applied onto the silicon-containing film 14s, for example, by spin coating. Then, heat treatment for vaporizing a solvent, that is, a prebake treatment (for example, for about 60 seconds at 100° C.) is carried out as needed. As the photoresist film 14p, for example, a top coat less positive chemical amplification resist film for ArF exposure is preferred. However, optical characteristics are different from those described in Section 2 (refer to FIG. 25). Thus, in this example, the multilayer resist film 14 is comprised of a three-layer stacked film of the carbon-rich film 14c, silicon-containing film 14s, and photoresist film 14p.

Then, reduction projection exposure is performed as described in Section 1, followed by PER (post exposure bake) if necessary, for example, for about 60 seconds at 100° C.

Next, as shown in FIG. 17, development is performed, for example, with an alkaline developer for about 30 seconds to pattern the photoresist film 14p, in other words, to process the photoresist film 14p to form a resist film opening 15 therein. Next, with the processed photoresist film 14p as a mask, the pattern of the photoresist film 14p is transferred to the silicon-containing film 14s by carrying out an etching treatment such as dry etching, for example, anisotropic dry etching such as RIE (reactive ion etching). At the time of completion of this transfer, the photoresist film 14p has usually disappeared as shown in FIG. 18 (this condition is of course unnecessary). As the etching condition, the following example is preferred: etching gas: $CF_4$ (flow rate, for example, at about 150 sccm), wafer stage preset temperature: about 60° C., and pressure in a treatment chamber: about 15 Pa.

Next, as shown in FIG. 18, with the processed silicon-containing film 14s as a mask, the pattern of the silicon-containing film 14s is transferred to the carbon-rich film 14c, for example, by carrying out an etching treatment such as dry etching, for example, anisotropic dry etching such as RIE. At the time of completion of this transfer, the silicon-containing film 14s has usually disappeared as shown in FIG. 19 (this condition is of course unnecessary). As the etching condition, the following example is preferred: etching gas: $H_2/N_2$ (flow rate, for example, at about 100 sccm/300 sccm), wafer stage preset temperature: about 60° C., and pressure in a treatment chamber: about 15 Pa.

Next as shown in FIG. 19, with the carbon-rich film 14c as a mask, an etching treatment such as dry etching, for example, anisotropic dry etching such as RIE is carried out, resulting in the formation of a through-hole 16 corresponding to the resist film opening 15 of the carbon-rich film 14c in the premetal silicon oxide-based insulating film 11 (first silicon oxide-based insulating film) as shown in FIG. 20. As the etching condition, the following example is preferred: etching gas: $C_4F_6/Ar/O_2$ (flow rate, for example, at about 20 sccm/500 sccm/20 sccm), wafer stage preset temperature: about 60° C., and pressure in a treatment chamber: about 15 Pa.

Next, the remaining carbon-rich film 14c is removed, for example, by ashing as shown in FIG. 21.

Next, under the state of FIG. 21, an etching treatment such as dry etching, for example, anisotropic dry etching such as RIE is carried out. By this treatment, the substrate-surface silicon nitride-based insulating film 8 (first silicon nitride-based insulating film) on the bottom of the through-hole 16, that is, the contact hole is removed as shown in FIG. 11. As the etching condition, the following example is preferred: etching gas: $CHF_3/Ar/O_2$ (flow rate, for example, at about 20 sccm/800 sccm/20 sccm), wafer stage preset temperature: about 60° C., and pressure in a treatment chamber: about 3 Pa.

All the treatments (including aching) from the step of transferring the pattern of the photoresist film 14p to the silicon-containing film 14s described referring to FIG. 17 to the silicon nitride-based insulating film removal step described referring to FIGS. 21 and 11 are carried out on the same wafer stage of the same treatment chamber (which will hereinafter be called "multilayer film in situ gas phase treatment"). In situ treatment is not essential but, such a treatment can drastically improve the treatment efficiency.

Treatments after the above-mentioned step are similar to those described in Section 2 referring to FIG. 12 to FIG. 14.

4. Complementary Description and General Consideration on First Embodiment (Including Modification Examples) (Mainly, from FIG. 22 to FIG. 26)

Figure 24:
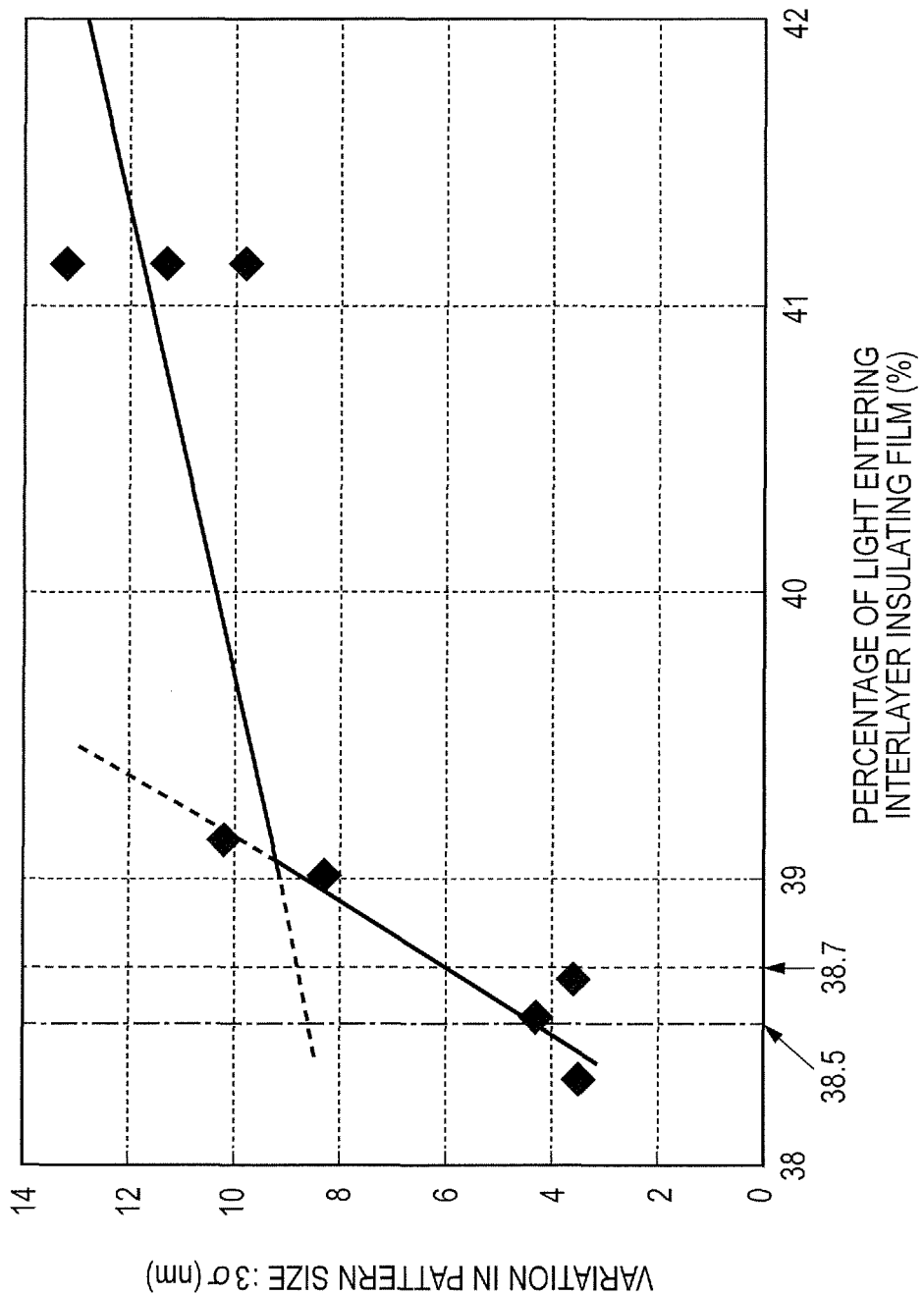
FIG. 24 is a plot of test results showing the relationship between a percentage of light entering an interlayer film and variation in pattern size for complementarily describing the main-part process of the method of manufacturing a semiconductor integrated circuit device according to First Embodiment of the present application.
Figure 26:
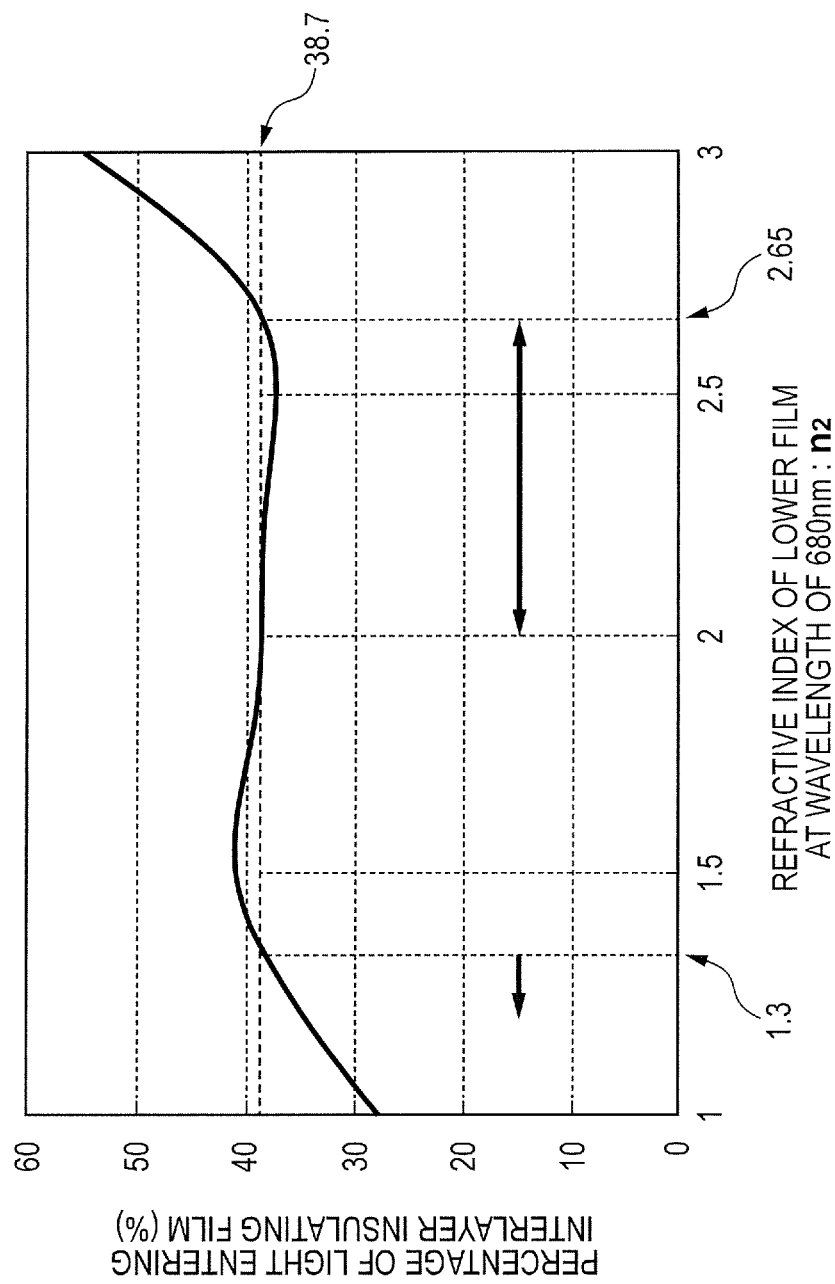
FIG. 26 is a plot of simulation results showing a reference beam (center wavelength: 680 nm) of a multilayer resist lower film and a percentage of light entering an interlayer film for complementarily describing the main-part process of the modification example of the method of manufacturing a semiconductor integrated circuit device according to First Embodiment of the present application.
Figure 27:
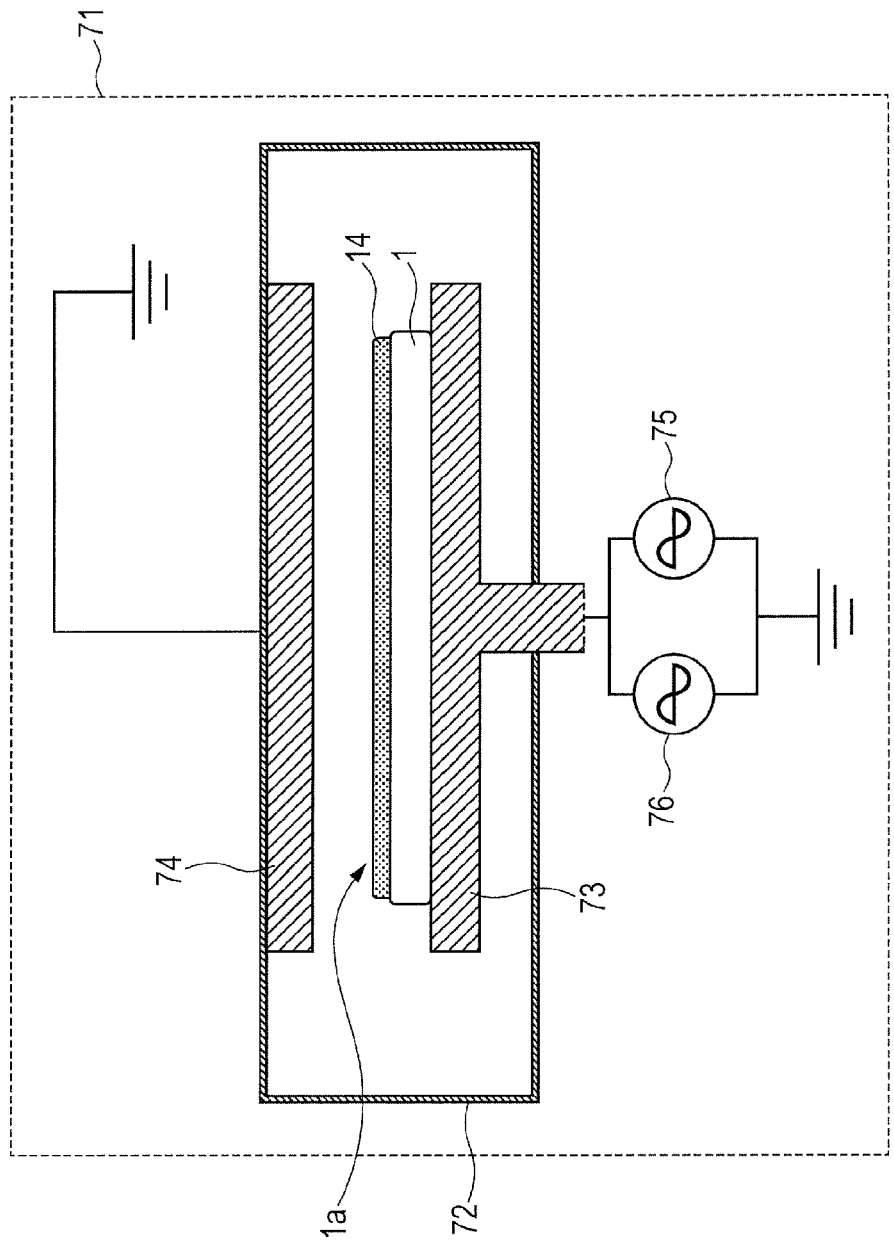
FIG. 27 is a schematic cross-sectional view of a wafer treatment apparatus for multilayer film in situ gas-phase treatment to be used in the main-part process (main process and modified process) of the method of manufacturing a semiconductor integrated circuit device according to First Embodiment of the present application.
Figure 28:
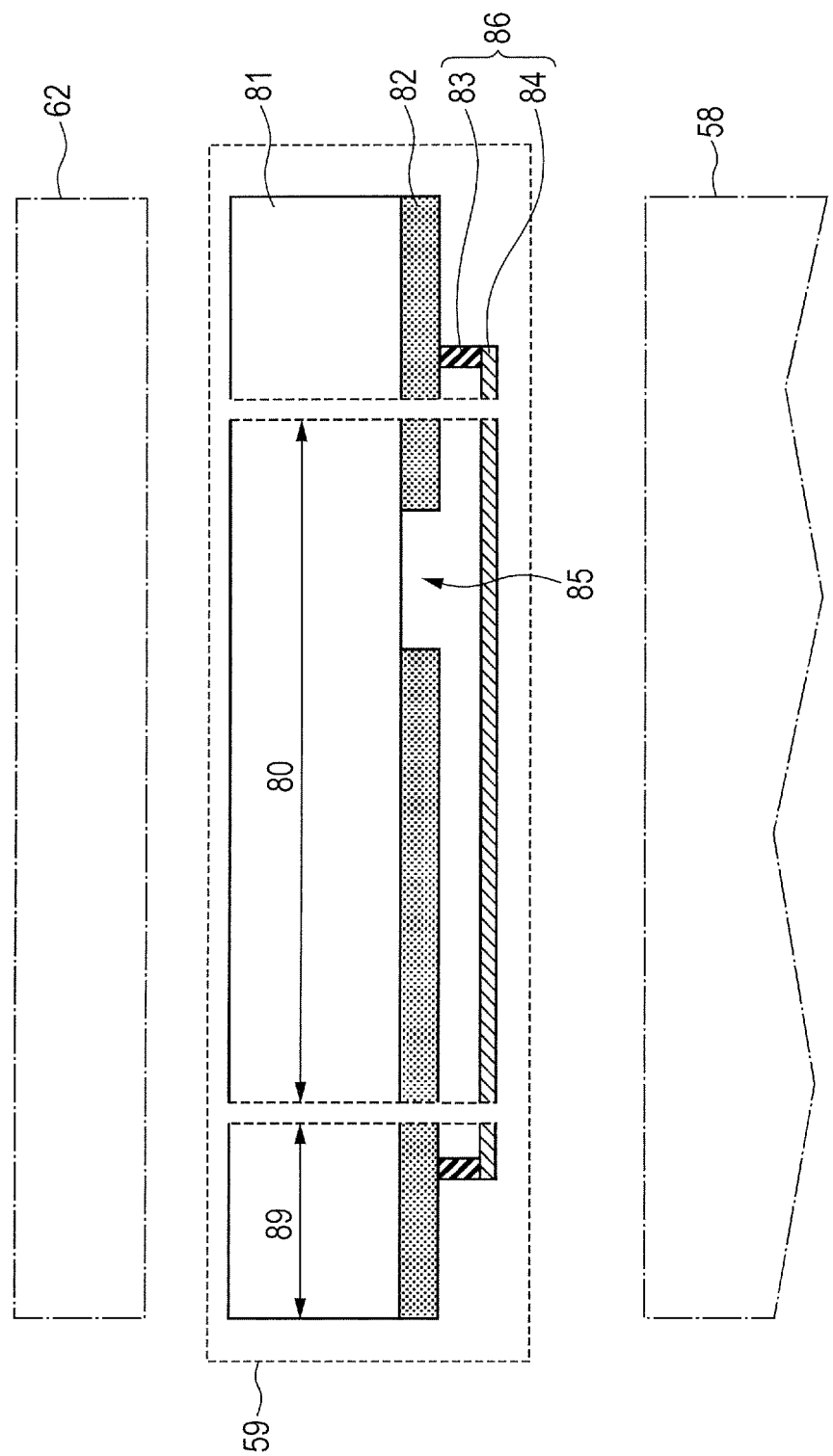
FIG. 28 is a schematic enlarged cross-sectional view of the optical mask shown in FIG. 1 and therearound.

FIG. 22 shows an example of principal parameters of each layer for complementarily describing the main-part process of the method of manufacturing a semiconductor integrated circuit device according to First Embodiment of the present application. FIG. 23 shows numerical data of various test results for complementarily describing the main-part process of the method of manufacturing a semiconductor integrated circuit device according to First Embodiment of the present application. FIG. 24 is a plot of test results showing the relationship between a percentage of light entering an interlayer film and variation in pattern size for complementarily describing the main-part process of the method of manufacturing a semiconductor integrated circuit device according to First Embodiment of the present application. FIG. 25 shows one example of principal parameters of each layer for complementarily describing the main-part process of a modification example of the method of manufacturing a semiconductor integrated circuit device according to First Embodiment of the present application. FIG. 26 is a plot of simulation results showing a reference beam (center wavelength: 680 nm) of a multilayer resist lower film and a percentage of light entering an interlayer film for complementarily describing the main-part process of the modification example of the method of manufacturing a semiconductor integrated circuit device according to First Embodiment of the present application. FIG. 27 is a schematic cross-sectional view of a wafer treatment apparatus for multilayer film in situ gas-phase treatment to be used in the main-part process (main process and modified process) of the method of manufacturing a semiconductor integrated circuit device according to First Embodiment of the present application. FIG. 28 is a schematic enlarged cross-sectional view of the optical mask shown in FIG. 1 and therearound. Based on these drawings, a complementary description and general consideration on First Embodiment (including modification examples thereof) will be made.

(1) Complementary Description on Technical Problems and the Like

As described above, in high-NA ArF liquid immersion exposure after the 45 nm technology node, particularly, in microfabrication steps such as contact step, variation in the diameter of a contact hole or the like has occurred frequently.

The present inventors investigated the cause of the variation. As a result, it has been revealed that in-wafer variation in the thickness of a so-called interlayer insulating film, that is, the premetal silicon oxide-based insulating film 11 (refer to FIG. 3) has an influence. Described specifically, due to uneven in-wafer distribution of CMP or the like, the premetal silicon oxide-based insulating film is likely to have variation in distribution. The multilayer resist film and the like are, on the other hand, applied onto the premetal silicon oxide-based insulating film and the like with a relatively uniform thickness. Variation in thickness of the premetal silicon oxide-based insulating film and the like is presumed not to have a serious adverse effect on the measurement of the height of the wafer surface (resist surface on which an exposure light is desired to be focused) insofar as a reference beam is reflected at the interface (which will hereinafter be called "lower end interface of multilayer resist film and the like") between the lower surface of the multilayer resist film and the upper surface of the premetal silicon oxide-based insulating film.

When a percentage of a reference beam that enters the premetal silicon oxide-based insulating film and the like, crossing the lower end interface of the multilayer resist and the like, and is reflected at the surface of the semiconductor substrate and the like exceeds a certain level, variation in thickness of the premetal silicon oxide-based insulating film and the like has an influence on a measurement system of the height of the wafer surface. This means that between a thin portion and a thick portion of the premetal silicon oxide-based insulating film and the like, there appears a measurement error in the measurement system of the height of the wafer surface due to variation in thickness of the premetal silicon oxide-based insulating film. As a result, out of focus of the exposure light and defocus of an optical image occur at a position where the thickness of the premetal silicon oxide-based insulating film and the like changes, causing a dimensional variation or shape deterioration of a resist pattern.

(2) Description on the Outline of the Method of Manufacturing a Semiconductor Integrated Circuit Device According to First Embodiment of the Present Application (Refer to Mainly FIG. 2)

For example, as shown in FIG. 2 (refer to FIG. 4), therefore, in the method (main process) of manufacturing a semiconductor integrated circuit device according to First Embodiment of the present application, the lower end surface of the multilayer resist film 14 (carbon-rich film) and the upper end surface of the premetal silicon oxide-based insulating film 11 (first silicon oxide-based insulating film) have there between the reference beam reflection accelerating film 12 (second silicon nitride-based insulating film).

The presence of the reference beam reflection accelerating film 12 suppresses a percentage of a reference beam entering the premetal silicon oxide-based insulating film 11, that is, a reference beam entering percentage, resulting in reduction in variation in diameter of a contact hole and the like.

This reference beam reflection accelerating film 12 (reflective film of an autofocus optical system probe light) should not hinder the exposure itself and should not require a huge amount of effort for film formation or removal of the film. In this example, however, general means such as CVD is used for film formation and a silicon nitride-based insulating film (for example, a silicon nitride film) having no problem in optical characteristics at an exposure wavelength is used as the reference beam reflection accelerating film 12. Thus, since a silicon nitride-based insulating film is used as the reference beam reflection accelerating film 12, removal thereof can be done simultaneously with the removal of the substrate-surface silicon nitride-based insulating film 8 (first silicon nitride-based insulating film), that is, an etch stop film, lying therebelow. This example has therefore the advantage of improving process-wise consistency and reducing the process cost.

(3) Complementary Description and General Consideration on the Main-Part Process (Main Process) of the Method of Manufacturing a Semiconductor Integrated Circuit Device According to First Embodiment of the Present Application (Mainly, from FIG. 22 to FIG. 24)

Principal parameters of each layer relating to the main-part process (main process) of the method of manufacturing a semiconductor integrated circuit device according to First Embodiment of the present application described above in Sections 1 and 2 are listed in a table and shown in FIG. 22.

With regard to an exposure light, by preventing reflection by using two layers, that is, the intermediate layer and the lower layer, the maximum reflectivity is 0.8% or less at N.A. ranging from 0.3 to 1.3 and thus, a sufficient antireflection effect can be achieved even if the reference beam reflection accelerating film is provided. This means that addition of the reference beam reflection accelerating film is presumed to have no adverse effect on exposure.

Next, test data under varied conditions are shown in FIGS. 23 and 24. As is apparent from FIG. 24, variation in pattern size decreases drastically from a reference beam entering percentage of 38.7% or less plotted on the abscissa. Therefore, the reference beam entering percentage (percentage of a reference beam entering a film to be processed, that is, the premetal silicon oxide-based insulating film 11) is preferably 38.7% or less. A theoretical lower limit of the entering percentage is 0%, but a practical lower limit is presumed to be about 30% from the standpoint of a limitation imposed by materials used. As one example of the reference beam, a light having a wavelength of 680 nm is used. When the reference beam is a broadband light, however, the entering percentage is determined from an entering percentage of a center-wavelength light (because effects are equal to each other). The broadband light as the reference beam may be a light of a band including a wavelength 680 nm or may be a light of a band not including it. Further, the reference beam may be a non-broadband light such as chromatic light.

(4) Complementary Description and General Consideration on the Outline and the Main-Part Process (Modified Process) of the Method of Manufacturing a Semiconductor Integrated Circuit Device According to First Embodiment of the Present Application (Mainly, FIGS. 25 and 26)

In the modification example described in Section 3, the carbon-rich film 14c of the multilayer resist film itself (FIG. 16) assumes the role of the reference beam reflection accelerating film 12 (FIG. 4) in the example described in Section 2. This modification example has therefore the advantage of omitting formation or removal of the reference beam reflection accelerating film 12. On the other hand, the carbon-rich film 14c should have both an antireflective effect of an exposure light and a reference beam reflection accelerating effect, which narrows the room for choice.

Next, simulation results showing a range of the refractive index of the carbon-rich film 1c to be selected are plotted with respect to the reference beam entering percentage in FIG. 26. As is apparent from FIG. 26, to satisfy the reference beam entering percentage not greater than 38.7%, it is preferred to select a material having a refractive index of 1.30 or less or a refractive index of 2.00 or more but not more than 2.65 with respect to the reference beam entering percentage.

This modification example (Section 3) is a modification example of the main process described in Sections 1 and 2 and it is obvious that the advantages described in the main process can be gained basically also in the present modification example unless otherwise stated that they cannot really be gained. An overlapping description on these merits is therefore omitted in principle in this sub-section and Section 3.

(5) Complementary Description on One Example of a Wafer Treatment Apparatus for Multilayer Film In Situ Gas Phase Treatment to be Used in the Main-Part Process (Main Process and Modified Process) of the Method of Manufacturing a Semiconductor Integrated Circuit Device According to First Embodiment of the Present Application (Mainly, FIG. 27)

One example of a wafer treatment apparatus to be used in multilayer film in situ gas phase treatment described in Sections 2 and 3 and a wafer placed during the treatment will be shown in FIG. 27. As shown in FIG. 27, a wafer treatment chamber 72 in a wafer gas phase treatment apparatus 71 for etching or the like has therein a lower electrode 73 (wafer stage, electrostatic chuck) and a wafer 1 having thereon a multilayer resist film 14 is placed on the lower electrode with the surface 1a (first main surface) up. The lower electrode 73 has thereover an upper electrode 74 facing thereto (a distance between these electrodes is, for example, from about 25 to 30 mm). The upper electrode 74 is, for example, grounded (which is, of course, not essential). To the lower electrode 73, for example, a high-frequency power source 75 (from about 27 MHz to 60 MHz) and a low-frequency power source 76 (for example, from about 800 kHz to 2 MHz) can be coupled if necessary and the other end of each of these power sources is grounded.

A specific description has been made herein with a CCP (capacitively coupled plasma) type dry etching apparatus as an example, but needless to say, an ICP (inductively coupled plasma) type dry etching apparatus or an ECR (electron cyclotron resonance) type dry etching apparatus may be used.

(6) Complementary Description on an Optical Mask and Therearound in an Exposure Apparatus in the Exposure Step of the Method (Including the Modification Example) of Manufacturing a Semiconductor Integrated Circuit Device According to First Embodiment of the Present Application (Refer Mainly to FIG. 28, FIG. 1, and the Like)

The optical mask and therearound during exposure in Section 1 will hereinafter be described complementarily. Described specifically, as one example of the optical mask 59 to be used in the exposure step described in Section 1, a halftone mask will be described. As shown in FIGS. 1 and 28, a quartz glass mask substrate 81 has, on one of the main surfaces thereof (on the side of an exposure optical system 58, that is, on the side opposite to an exposure illumination apparatus 62), a semi-transparent phase shift mask 82 (a semi-transparent phase shift film providing a phase shift of 180 degrees or equivalent thereto). The quartz glass mask substrate 81 has, in an inside region of the one of the main surfaces thereof, a circuit pattern region 80 (here, the circuit pattern region 80 is, for example, a portion corresponding to the cross-sectional view of FIG. 5). The semi-transparent phase shift film 82 in the circuit pattern region 80 has a mask opening 85, for example, corresponding to the resist film opening 15 of FIG. 5. Onto the semi-transparent phase shift film 82, a pellicle 86 comprised of a pellicle frame 83 and a pellicle film 84 is attached so as to cover the entirety of the circuit pattern region 80 (the pellicle frame 83 is attached to a mask peripheral region 89).

(7) Complementary Description and Consideration on Another Mode of a Main-Part Process (Main Process) of the Method of Manufacturing a Semiconductor Integrated Circuit Device According to First Embodiment of the Present Application (Refer to Mainly FIG. 4 and the Like)

As the reference beam reflection accelerating film described in Section 2 referring to FIG. 4 and the like, an inorganic insulating film such as silicon nitride film is preferred, but as well as the silicon nitride-based insulating film such as silicon nitride film, insulating films other than the silicon nitride-based insulating film, conductive films, and the like can also be used. The intermediate film and the lower film below the photosensitive resist film in the multilayer resist film comprised of three-layer resist films can be considered together as BARC (bottom anti-reflection coating) so that the above-mentioned embodiment (including modification examples) can also be applied not only to a three-layer resist film but also a two-layer resist, a four-layer resist, and another multilayer resist process. In the above-mentioned embodiment, reflection of a reference beam is accelerated by placing, as an underlying film of the resist film, the reference beam reflection accelerating film for accelerating reflection of a reference beam so that it can be applied to not only the multilayer resist process but also a single layer resist process.

5. Summary

The invention made by the present inventors has been described specifically based on the embodiment. The invention is not limited to or by it, but can be changed in various ways without departing from the scope of the invention.

For example, the present embodiment has been described with liquid immersion exposure as a main example. The invention is however not limited to it and can be applied to non-liquid immersion exposure. Similarly, the embodiment has been described specifically with a liquid composed mainly of water as an example of a liquid medium for liquid immersion exposure. The invention is however not limited to it and needless to say, can be applied also to liquid immersion exposure using a liquid medium having a higher refractive index.

In the above-mentioned embodiment, a specific description has been made using nickel platinum silicide mainly as an example of a silicide. The invention is however not limited to it but, needless to say, as well as nickel platinum silicide, titanium silicide, cobalt silicide, nickel silicide, or another silicide may be used as the silicide.

What is claimed is:

1. A method of manufacturing a semiconductor integrated circuit device comprising the steps of:
   (a) forming a first silicon nitride-based insulating film over a first main surface of a semiconductor wafer;
   (b) forming a first silicon oxide-based insulating film over the first silicon nitride-based insulating film;
   (c) forming a second silicon nitride-based insulating film over the first silicon oxide-based insulating film;
   d) applying a carbon-rich film directly onto the second silicon nitride-based insulating film;
   (e) applying a silicon-containing film containing carbon and silicon as main components thereof directly onto the carbon-rich film;
   (f) applying a photoresist film directly onto the silicon-containing film;
   (g) exposing the photoresist film by reduction projection exposure using an ultraviolet exposure light;
   (h) after the step (g), developing the photoresist film to pattern the photoresist film and transferring the resulting pattern to the silicon-containing film and the carbon-rich film successively;
   (i) forming a through-hole in the second silicon nitride-based insulating film by first dry etching with the resulting carbon-rich film as a mask;
   (j) after the step (i), extending the through-hole to a bottom surface of the first silicon oxide-based insulating film by second dry etching with the carbon-rich film as a mask;
   (k) after the step (j), removing the carbon-rich film; and
   (l) after the step (k), removing the second silicon nitride-based insulating film outside the through-hole and the first silicon nitride-based insulating film at a bottom of the through-hole,
   wherein in the step (g), by an off-axis type oblique incidence autofocus optical system using a reference beam having a wavelength longer than that of the ultraviolet exposure light, the reference beam is made incident obliquely to the first main surface of the semiconductor wafer and based on the reflected light, autofocusing is performed.

2. The method of manufacturing a semiconductor integrated circuit device according to claim 1,
   wherein the second silicon nitride-based insulating film is a silicon nitride film.

3. The method of manufacturing a semiconductor integrated circuit device according to claim 2,
   wherein the ultraviolet exposure light is an exposure light having a wavelength of 193 nm from an ArF excimer laser.

4. The method of manufacturing a semiconductor integrated circuit device according to claim 3,
   wherein the reference beam is a visible light.

5. The method of manufacturing a semiconductor integrated circuit device according to claim 3,
   wherein the reference beam is a broadband light in the visible region.

6. The method of manufacturing a semiconductor integrated circuit device according to claim 5,
   wherein the reduction projection exposure is liquid immersion exposure.

7. The method of manufacturing a semiconductor integrated circuit device according to claim 6,
   wherein a liquid to be used in the liquid immersion exposure contains water as a main component thereof.

8. The method of manufacturing a semiconductor integrated circuit device according to claim 7,
   wherein the reduction projection exposure is performed using a halftone mask.

9. The method of manufacturing a semiconductor integrated circuit device according to claim 8,
   wherein a percentage of the reference beam entering the first silicon oxide-based insulating film in the step (g) is 38.7% or less in terms of an entering percentage of a center-wavelength reference beam.

10. A method of manufacturing a semiconductor integrated circuit device comprising the steps of:
    (a) forming a first silicon nitride-based insulating film over a first main surface of a semiconductor wafer;
    (b) forming a first silicon oxide-based insulating film over the first silicon nitride-based insulating film;
    (c) applying a carbon-rich film directly onto the first silicon oxide-based insulating film;
    (d) applying a silicon-containing film containing carbon and silicon as main components thereof directly onto the carbon-rich film;
    (e) applying a photoresist film directly onto the silicon-containing film;
    (f) exposing the photoresist film by reduction projection exposure using an ultraviolet exposure light;
    (g) after the step (f), developing and thereby patterning the photoresist film and transferring the resulting pattern to the silicon-containing film and the carbon-rich film successively;
    (h) forming a through-hole in the first silicon oxide-based insulating by first dry etching with the resulting carbon-rich film as a mask;
    (i) after the step (h), removing the carbon-rich film; and (j) after the step (i), removing the first silicon nitride-based insulating film at a bottom of the through-hole, wherein, in the step (f), by an off-axis type oblique incidence autofocus optical system using a reference beam which is a broadband light in the visible region, the reference beam is made incident obliquely to the first main surface of the semiconductor wafer, and, based on the reflected light, autofocusing is performed, and wherein a percentage of the reference beam entering the first silicon oxide-based insulating film is 38.7% or less in terms of an entering percentage of a center-wavelength reference beam.

11. The method of manufacturing a semiconductor integrated circuit device according to claim 10, wherein the ultraviolet exposure light is an exposure light having a wavelength of 193 nm from an ArF excimer laser.

12. The method of manufacturing a semiconductor integrated circuit device according to claim 11, wherein the reduction projection exposure is liquid immersion exposure.

13. The method of manufacturing a semiconductor integrated circuit device according to claim 12, wherein a liquid to be used in the liquid immersion exposure contains water as a main component thereof.

14. The method of manufacturing a semiconductor integrated circuit device according to claim 13, wherein the reduction projection exposure is performed using a halftone mask.

15. The method of manufacturing a semiconductor integrated circuit device according to claim 14, wherein no silicon nitride-based insulating film is provided between the first silicon nitride-based insulating film and the carbon-rich film in at least the step (f).

* * * * *